(12) United States Patent
Yamazaki et al.

(10) Patent No.: US 7,030,681 B2
(45) Date of Patent: Apr. 18, 2006

(54) SEMICONDUCTOR DEVICE WITH MULTIPLE POWER SOURCES

(75) Inventors: Akira Yamazaki, Hyogo (JP); Fukashi Morishita, Hyogo (JP); Yasuhiko Taito, Hyogo (JP); Nobuyuki Fujii, Hyogo (JP); Mako Okamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/118,432

(22) Filed: Apr. 9, 2002

(65) Prior Publication Data

US 2002/0171461 A1    Nov. 21, 2002

(30) Foreign Application Priority Data

May 18, 2001  (JP) .............................. 2001-149464

(51) Int. Cl.
*G05F 1/10* (2006.01)
(52) U.S. Cl. .................. 327/534; 327/540; 327/143
(58) Field of Classification Search ................ 327/143, 327/534, 536, 538, 540
See application file for complete search history.

(56) References Cited

U.S. PATENT DOCUMENTS

| | | | | |
|---|---|---|---|---|
| 5,034,625 A | * | 7/1991 | Min et al. .................... | 327/536 |
| 5,304,859 A | * | 4/1994 | Arimoto ...................... | 327/535 |
| 5,592,430 A | * | 1/1997 | Ohtsuki ...................... | 365/226 |
| 6,052,022 A | * | 4/2000 | Lee ............................. | 327/589 |
| 6,201,437 B1 | * | 3/2001 | Kono et al. .................. | 327/545 |
| 6,320,454 B1 | * | 11/2001 | Pathak et al. ................ | 327/535 |
| 6,472,926 B1 | * | 10/2002 | Taito et al. .................. | 327/536 |
| 2002/0011883 A1 | * | 1/2002 | Yamazaki et al. ........... | 327/143 |

FOREIGN PATENT DOCUMENTS

JP        10-32259        2/1998
JP        2000-339958     12/2000

* cited by examiner

*Primary Examiner*—Terry D. Cunningham
(74) *Attorney, Agent, or Firm*—McDermott Will & Emery LLP

(57) ABSTRACT

Well bias voltages are generated in accordance with a logic power supply voltage and a memory power supply voltage. The transistor included in a control circuit in a memory core is constituted of a logic transistor manufactured through the same manufacturing steps as those for the transistors of a logic formed on the same semiconductor substrate. Well bias voltages (VBB, VPP) are applied to a back gate of this logic transistor. A memory integrated with a logic on a common semiconductor substrate is provided which allows a transistor of a control circuit therein to be manufactured through the same manufacturing process as that of the logic and allows reduction of current consumption.

5 Claims, 16 Drawing Sheets

SEMICONDUCTOR DEVICE WITH MULTIPLE POWER SOURCES

BACKGROUND OF THE INVENTION

1. Field of the Invention

The present invention relates to a semiconductor device and particularly relates to a semiconductor device with a multiple power sources, which is operated with a plurality of power sources. More specifically, the present invention relates to an embedded memory integrated on a common semiconductor chip with a logic circuit. More particularly, the present invention relates to the construction of internal voltage generation circuitry of an embedded memory.

2. Description of the Background Art

Recently, system LSI's (large scale integrated circuits) each having a logic circuit and a large storage capacity DRAM (dynamic random access memory) integrated on the same semiconductor substrate are widely used.

FIG. 36 is a schematic diagram showing a construction of a power source of a conventional system LSI. In FIG. 36, the system LSI includes a logic LG such as a processor and a DRAM macro DM serving as a main memory for logic LG.

DRAM macro DM includes a memory cell array MA having memory cells arranged in a matrix of rows and columns, a sense amplifier SA sensing, amplifying and latching the data of memory cells connected to a selected row in memory array MA, a row decoder RD selecting an addressed row in memory cell array MA, a control circuit CTL controlling the internal operation of DRAM macro DM, and an internal voltage generation circuit IVGA receiving an external power supply voltage VDDH and generating internal voltages VDDS, VPP and VBB.

Internal voltage VDDS is used as the operating power supply voltage of sense amplifier SA. Sense amplifier power supply voltage (or array power supply voltage) VDDS determines the H voltage level of data stored in a memory cell in memory cell array MA.

Internal voltage VPP is transmitted to a word line arranged corresponding to the selected row in memory cell array MA through row decoder RD. The voltage (boosted voltage) VPP is generated by boosting external power supply voltage VDDH through, for example, a charge pumping operation.

Internal voltage VBB is a negative voltage and applied, as a bias voltage, to the substrate region of memory cell array MA. Substrate bias voltage VBB allows the threshold voltage of each memory cell transistor formed in memory cell array to be stabilized and the junction capacitance of the memory transistor to be reduced.

An external power supply voltage VDDL is applied to logic LG and control circuit CTL. Since MOS transistors (insulated gate type field effect transistors) used in logic LG and control circuit CTL in DRAM macro DM are normally operated at high speed, the absolute values of the threshold voltages of the MOS transistors are set smaller than the absolute values of the threshold values of MOS transistors used in the memory cell array MA of DRAM macro DM. For a MOS transistor used in logic LG, in particular, a MOS transistor (low Vth transistor) having a small absolute value of the threshold voltage is employed in view of high speed operability and low power consumption. Therefore, the MOS transistor in logic LG causes a large leak current (large off-leak current) when being turned off.

Meanwhile, the MOS transistor used in control circuit CT in DRAM macro DM is not required to be operated at high speed, compared with the MOS transistor of logic LG. Thus, the MOS transistor included in control circuit CTL at periphery of the memory cell array may be greater in absolute value of the threshold voltage than the MOS transistor in logic LG (referred to as "logic transistor" hereinafter). However, if the MOS transistor having the absolute value of the threshold voltage different from that of the logic transistor is used in control circuit CTL, it is necessary to manufacture the logic transistor of logic LG and the MOS transistor of control circuit CTL in individual different manufacturing steps, which disadvantageously increases manufacturing cost.

For that reason, the logic transistor is also used for control circuit CTL. That is, a MOS transistor equal in size (equal in gate insulating film thickness) to the MOS transistor used for logic LG is used as the MOS transistor for control circuit CTL. Thus, the logic transistor is used as the MOS transistor for control circuit CTL, and therefore, the standby current in control circuit CTL in DRAM macro DM disadvantageously increases and low current consumption cannot be achieved.

The gate insulating film thickness of the logic transistor is made small for the purpose of reducing the threshold voltage, and the gate insulating film thickness of the MOS transistor is generally determined according to an applied power supply voltage. Therefore, power supply voltage VDDL applied to logic LG and control circuit CTL (referred to as "logic power supply voltage" hereinafter) is made lower than power supply voltage VDDH applied to DRAM macro DM (referred to as "memory power supply voltage" hereinafter).

FIG. 37A shows an example of the construction of a logic element included in logic LG. FIG. 37A representatively shows a CMOS (complementary MOS) inverter as a typical component of the logic. In FIG. 37A, the CMOS inverter of logic LG includes a P channel MOS transistor PQ1 connected between a logic power source node and an output node, having a gate receiving an input signal IN and having a back gate (substrate region) connected to the logic power source node, and an N channel MOS transistor NQ1 connected between the output node and a ground node, having a gate receiving the input signal IN and having a back gate (substrate region) connected to the ground node. Logic power supply voltage VDDL is supplied to the logic source node and a ground voltage GND is supplied to the ground node.

Each of logic transistors PQ1 and NQ1 shown in FIG. 37A has a small absolute value of the threshold voltage and also has a gate insulating film made thin in accordance with, for example, a predetermined scaling rule, for shrinking of the transistor size.

FIG. 37B is a schematic diagram showing the cross sectional structure of the CMOS inverter shown in FIG. 37A. In FIG. 37B, P channel MOS transistor PQ1 is formed at the surface of an N well 1000 biased to a logic power supply voltage VDDL level through an N type impurity region 1001. P channel MOS transistor PQ1 includes P type impurity regions 1002 and 1003 formed spaced from each other on the surface of N well 1000, and a gate electrode 1004 formed on the well region between impurity regions 1002 and 1003 with a not shown gate insulating film interposed below.

Impurity region 1002 is supplied with logic power supply voltage VDDL, and impurity region 1003 is coupled to the output node for generating an output signal OUT. Gate electrode 1004 is supplied with input signal IN. Impurity region 1002 serves as a source region.

N channel MOS transistor NQ1 is formed on the surface of a P well 1010 biased to a ground voltage GND level through a P type impurity region 1001. N channel MOS transistor NQ1 includes N type impurity regions 1012 and 1013 formed to be away from each other on the surface of P well 1010, and a gate electrode 1014 formed on the well region between impurity regions 1012 and 1013 with a not shown gate insulating film interposed in between.

Impurity region 1012 is connected to the ground node, and serves as a source. Impurity region 1013 is connected to the output node. Gate electrode 1014 receives input signal IN.

As shown in FIGS. 37A and 37B, the high speed operation of each of MOS transistors PQ1 and NQ1 can be achieved by connecting the source to each respective back gate and suppressing a substrate bias effect.

FIG. 38A is a circuit diagram showing the electrically equivalent circuit of the P channel MOS transistor employed in memory cell array MA and sense amplifier SA in DRAM macro DM. In FIG. 38A, a P channel MOS transistor PQ2 has a source receiving array power supply voltage VDDS and a back gate receiving boosted voltage VPP. The gate of MOS transistor PQ2 is supplied with a voltage having an amplitude determined according to application. For example, if P channel MOS transistor PQ2 is an MOS transistor included in sense amplifier SA shown in FIG. 36, the gate thereof is connected to a bit line of memory cell array MA and the voltage level of the bit line is driven to the ground voltage level, precharge voltage level or array power supply voltage level. When MOS transistor PQ2 is rendered conductive, array source voltage VDDS is transmitted to the drain thereof. By applying boosted voltage VPP to the substrate region, the absolute value of the threshold voltage of the transistor PQ2 is made great, the influence of the noise of array source voltage VDDS is reduced to prevent a P channel MOS transistor, which should be kept off, from being turned on.

If P channel MOS transistor PQ2 is included in a word driver transmitting boosting voltage VPP to a selected word line, the source of the transistor PQ2 is supplied with boosted voltage VPP or receives a signal having an amplitude of VPP in place of array power supply voltage VDDS. Even if the P channel MOS transistor is used in such a word driver, the source attains a boosted voltage level at maximum, so that boosted voltage VPP is applied to the substrate region (back gate) thereof.

FIG. 38B is a circuit diagram showing the electrically equivalent circuit of N channel MOS transistor NQ2 employed in memory cell array MA and sense amplifier SA. In FIG. 38B, the source of N channel MOS transistor NQ2 is connected to the ground node and the back gate thereof receives a substrate bias voltage VBB. The gate of the transistor NQ2 is supplied with a signal of an amplitude determined according to application. MOS transistor NQ2 supplies ground voltage GND to the drain when being conductive.

Substrate bias voltage VBB is applied to the back gate of an access transistor of a memory cell included in memory cell array MA. If N channel MOS transistor NQ2 is used as the access transistor of the memory cell, the drain/source thereof is connected to a storage node storing information and source/drain is connected to a bit line. Here, the source and drain of the MOS transistor are exchanged in position according to their respective voltage levels.

If N channel MOS transistor NQ2 is used in the word driver, the back gate thereof receives a negative voltage to set the threshold voltage high, whereby N channel MOS transistor NQ2 is reliably set in an off state without an influence of ground node noise.

Normally, boosted voltage VPP is at the voltage level of a voltage transmitted onto word lines WL's arranged corresponding to the rows of the memory cells in memory cell array MA. N channel MOS transistor shown in FIG. 38B is used in, for example, a word driver for driving a word line into a select state.

As shown in FIGS. 38A and 38B, it is intended, by deepening the back gate bias of the MOS transistor, to stabilize the threshold voltage and to enhance power source noise immunity.

A logic element having the same construction as that shown in FIG. 37A is used in control circuit CTL. In this case, the off-leak current of the MOS transistor increases. Therefore, a countermeasure for increasing the absolute value of the threshold voltage of the MOS transistor by deepening the well bias so as to reduce the off-leak current, is normally used.

FIG. 39 shows an example of the construction of a logic element included in control circuit CTL shown in FIG. 36. In FIG. 39, the logic element of control circuit CTL has the construction of a CMOS inverter formed of a P channel MOS transistor PQ3 and an N channel MOS transistor NQ3. Boosted voltage VPP is applied to the back gate of P channel MOS transistor PQ3 from a VPP generation circuit 1020 and negative voltage VBB is applied to the back gate of N channel MOS transistor NQ3 from a VBB generation circuit 1030. Negative voltage VBB may be the same as or different from substrate bias voltage VBB applied to the substrate region of memory cell array MA. In the following description, therefore, internal voltage VBB will be simply referred to as "negative voltage".

The source of P channel MOS transistor PQ3 is connected to the logic power source node and the source of N channel MOS transistor NQ3 is connected to the ground node. VPP generation circuit 1020 and VBB generation circuit 1030 are included in internal voltage generation circuit INVG shown in FIG. 36. VPP generation circuit 1020 and VBB generation circuit 1030 receive memory power supply voltage VDDH as an operating power supply voltage and generate boosted voltage VPP and negative voltage VBB through, for example, a charge pumping operation, respectively.

Boosted voltage VPP is higher in level than logic power supply voltage VDDL and negative voltage VBB is lower in level than ground voltage GND. Accordingly, the back gate biases of MOS transistors PQ3 and NQ3 are deeper than that of a transistor having a back gate and a source connected together. As a result, the absolute values of the threshold voltages of MOS transistors PQ3 and NQ3 becomes greater, thereby making it possible to reduce off-leak current. Therefore, by using a logic transistor having the same structure (same in gate insulating film thickness and material) as that of the transistor included in logic LG, in DRAM macro DM and deepening the bias of the back gate of the transistor, it is possible to reduce off-leak current and to achieve low standby current accordingly. Also, the transistor of control circuit CTL and the transistor of logic LG can be manufactured in the same manufacturing steps to reduce manufacturing cost.

FIG. 40 is a schematic diagram showing the cross sectional structure of the CMOS transistor included in control circuit CTL of the DRAM macro shown in FIG. 39. In FIG. 40, MOS transistor PQ3 is formed in an N well 1040 and N channel MOS transistor NQ3 is formed in a P well 1050. N well 1040 is supplied with boosted voltage VPP from VPP generation circuit 1020 through an N type impurity region

1041. P well 1050 is supplied with negative voltage VBB from VBB generation circuit 1030 through a P type impurity region 1051.

P channel MOS transistor 1040 includes P type impurity regions 1042 and 1043 formed, spaced from each other, on the surface of N well 1040 and a gate electrode 1044 formed with a not shown gate insulating film interposed in between on the surface of the N well region between impurity regions 1042 and 1043.

N channel MOS transistor NQ3 includes N type impurity regions 1052 and 1053 formed, spaced from each other, on the surface of P well 1050 and a gate electrode 1054 formed with a not shown gate insulating film interposed in between on the surface of the P well region between impurity regions 1052 and 1053.

Impurity region 1042 receives logic power supply voltage VDDL and impurity region 1052 receives ground voltage GND. Impurity regions 1043 and 1053 are coupled to an output node and gate electrodes 1044 and 1054 receives input signal IN.

In the construction of the CMOS inverter shown in FIG. 40, a parasitic PNP bipolar transistor Q1 having an emitter formed of P type impurity region 1042, collector formed of P type impurity region 1043 and P well 1050 and a base formed of N well 1040, is formed in N well 1040. A parasitic diode D1 is formed between P type impurity region 1042 and N type impurity region 1041. A resistance R1 produced by the substrate resistance of N well 1040 exists between the base region of parasitic PNP bipolar transistor Q1 and the cathode (node n1) of parasitic diode D1.

On the other hand, a parasitic NPN bipolar transistor Q2 having N type impurity region 1052 serving as an emitter, P well 1050 serving as a base region and N well 1040 serving as a collector, is formed in P well 1050. Negative voltage VBB is applied to the base of parasitic NPN bipolar transistor Q2 from impurity region 1051 through a resistance R2.

If the parasitic bipolar transistors stated above exist and logic power supply voltage VDDL is applied before application of memory power supply voltage VDDH, VPP generation circuit 1020 and VBB generation circuit 1030 are not operated and therefore, boosted voltage VPP and negative voltage VBB are not generated. Under such condition, each of VPP generation circuit 1020 and VBB generation circuit 1030 is in an output high impedance state (i.e., the charge transferring MOS transistor at the output stage of each circuit is kept off). Thus, although boosted voltage VPP is not generated, the level of the well potential fixing node n1 (impurity region 1041) of P type MOS transistor PQ3 becomes a potential level of a voltage (VDDL-$\phi$b) because of the presence of parasitic diode D1. Here, $\phi$b denotes the diffusion potential of parasitic diode D1.

The potential of N well potential fixing node n1 is applied through parasitic resistance R1 to a node n2. A voltage drop substantially equal to the forward voltage drop between the base and emitter of parasitic bipolar transistor Q1 is caused due to parasitic diode D1. Further, a voltage drop occurs through parasitic resistance R1. Thus, the emitter to base region of parasitic bipolar transistor Q1 is forwardly biased and a current Ic1 flows between the emitter and the collector of parasitic bipolar transistor Q1.

Collector current Ic1 of parasitic bipolar transistor Q1 causes base electrode node n3 of parasitic NPN bipolar transistor Q2 to have a positive potential level higher than the ground voltage level. If base electrode node n3 has a positive potential, then the base to emitter region of parasitic bipolar transistor Q2 is forwardly biased, parasitic bipolar transistor Q2 becomes conductive and a collector current Ic2 flows between the collector and the emitter of parasitic bipolar transistor Q2. Parasitic bipolar transistor Q2 receives collector current Ic1 supplied from parasitic bipolar transistor Q1 as a base current. Collector current Ic2 which is 'hfe' times the collector current Ic1, flows through parasitic bipolar transistor Q2 from the logic source node through impurity region 1042, well potential fixing node n1 and internal node n2, and collector current Ic2 further flows to the ground node through impurity region 1052.

Accordingly, if a thyristor formed of parasitic bipolar transistors Q1 and Q2 is turned on, a large current flows into impurity region 1052 coupled to the ground node from impurity region 1042 coupled to the logic source node. If parasitic bipolar transistors Q1 and Q2 perform a thyristor operation, i.e., a so-called "latch-up phenomenon" occurs, the thyristor operation cannot be stopped thereafter even by applying memory power supply voltage VDDH and generating boosted voltage VPP and negative voltage VBB. If this "latch-up phenomenon" occurs, a large current flows due to the thyristor operation of these parasitic bipolar transistors, and the MOS transistors may be destructed or a signal interconnection line may be cut off due to generated heat. If such a latch-up phenomenon occurs, it is only possible to stop the thyristor operation by shutting off the supply of the power supply voltage. However, it is impossible to instantly identify externally whether or not the latch-up phenomenon occurs internally.

For the system LSI as stated above, if a plurality of power sources are employed and the DRAM core is driven with the plural power supply voltages, a power application sequence is not predetermined in the specification. In practical use, the order of applying memory power supply voltage VDDH and logic power supply voltage VDL is variously set, and therefore, there is a possibility of the occurrence of the latch-up phenomenon as described above. Therefore, a construction in which the peripheral circuit of the DRAM macro is formed of the logic transistors having the back gate bias thereof adjusted to increase the absolute value of the threshold voltage cannot be employed. As a result, the logic transistor cannot be used for the control circuit at the peripheral circuit of the DRAM macro and manufacturing cost cannot be reduced. Besides, if the logic transistor is used for the DRAM peripheral control circuit, a well bias cannot be adjusted and therefore, the standby current cannot be reduced.

SUMMARY OF THE INVENTION

It is an object of the present invention to provide a semiconductor device with multiple power sources, capable of reducing both manufacturing cost and standby current.

It is another object of the present invention to provide a semiconductor device with multiple power sources, capable of reliably causing no latch-up phenomenon irrespectively of a power application sequence.

It is a specific object of the present invention to provide an embedded memory capable of reducing manufacturing cost and standby current and preventing the occurrence of a latch-up phenomenon irrespectively of a power application sequence.

A semiconductor device according to a first aspect of the present invention includes first and second bias voltage generation circuits receiving at least first and second power supply voltages, and generating a substrate bias voltage applied to a substrate region in accordance with the first and second power supply voltages, respectively.

A semiconductor device according to a second aspect of the present invention includes a substrate bias voltage generation circuit receiving the first power supply voltage as an operating power supply voltage, and generating a substrate bias voltage applied to a substrate region; a power up detection circuit for detecting the application of the first power supply voltage; and a clamp circuit receiving the second power supply voltage as an operating power supply voltage, and clamping a voltage level of the substrate bias voltage to a ground voltage level when the power up detection signal is activated.

A semiconductor device according to a third aspect of the present invention includes first and second internal voltage generation circuits generating an internal voltage in accordance with first and second power supply voltages, respectively. This internal voltage differs in voltage level from the first and second power supply voltages.

A semiconductor device according to a fourth aspect of the present invention includes an internal voltage generation circuit receiving the first power supply voltage as an operating power supply voltage, and generating an internal voltage; a power up detection circuit for detecting the application of the first power supply voltage; and a voltage setting circuit for setting the internal voltage at the second power supply voltage level in response to the power up detection signal.

A semiconductor device according to a fifth aspect of the present invention includes an internal voltage generation circuit receiving the first power supply voltage as an operating power supply voltage, and generating an internal voltage; a power up detection circuit for detecting the application of the first power supply voltage, and generating a power up detection signal in accordance with the detection result; a first voltage setting circuit for setting the internal voltage at a level of the second power supply voltage in response to activation of the power up detection signal; and a second voltage setting circuit for setting the internal voltage at a level of the first power supply voltage in response to the activation of the power up detection signal.

In a semiconductor device operating with the voltages from the multiple power sources, the same internal voltage is generated using the voltages of these multiple power sources, whereby it is possible to stably generate the internal voltage irrespectively of a power application sequence, to prevent the internal voltage node from entering a high impedance state and to prevent the occurrence of a latch-up phenomenon.

Further, in a power application sequence in which a latch-up phenomenon may possibly occur, by setting the internal voltage at a predetermined voltage level until a power supply voltage is applied normally, it is possible to prevent the base to emitter region of a parasitic bipolar transistor from being forwardly biased and to prevent parasitic bipolar transistors from performing a thyristor operation irrespectively of the power application sequence.

Furthermore, if the internal voltage is generated using one power supply voltage through a power source sequence in which a latch-up phenomenon may possibly occur, the internal voltage is set at a predetermined voltage level so as to set the base to emitter region of the parasitic bipolar transistor in an inverse bias state until a normal power supply voltage is applied so as to prevent the occurrence of a latch-up phenomenon, it is possible to prevent a latch-up phenomenon from occurring irrespectively of the power application sequence.

By preventing the occurrence of a latch-up phenomenon irrespectively of this power up sequence, it is possible to use a logic transistor in the control circuit of a memory macro and to set greater the absolute value of the threshold voltage of the logic transistor of the control circuit, reducing the manufacturing cost and the standby current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
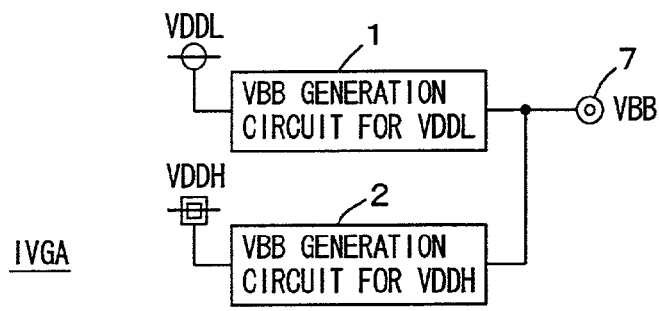
FIG. 1 is a schematic diagram showing the construction of a negative voltage generation circuit in a first embodiment according to the present invention.
Figure 36:
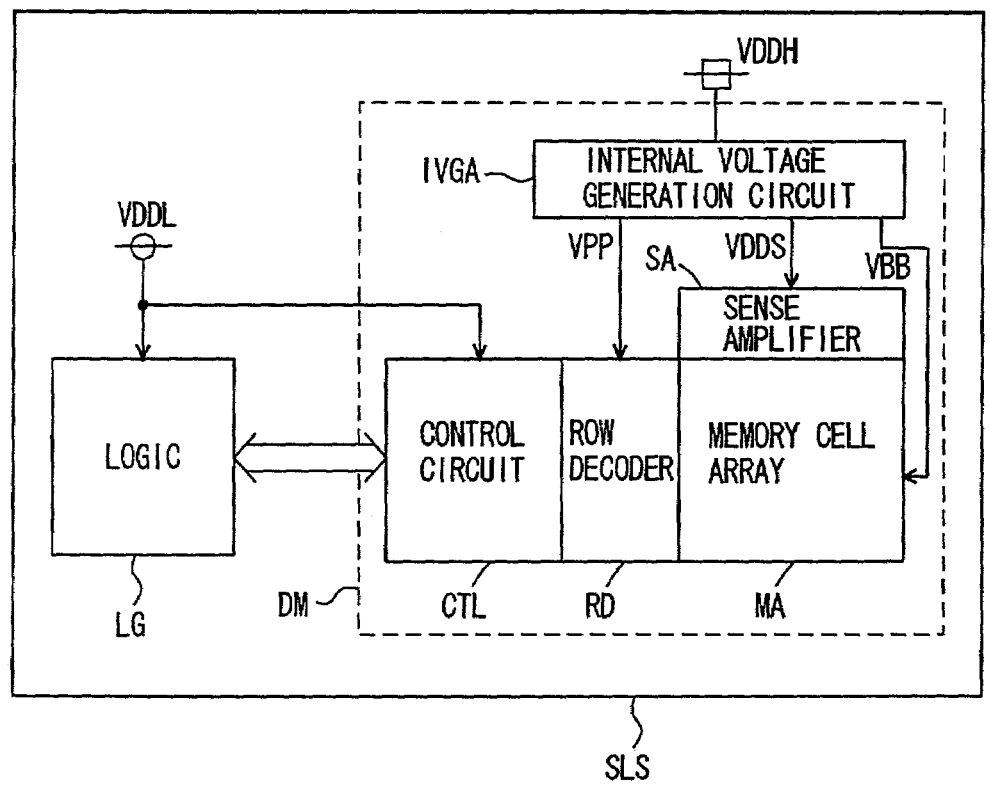
FIG. 36 is a schematic diagram showing the overall construction of a conventional system LSI.
Figure 37A:
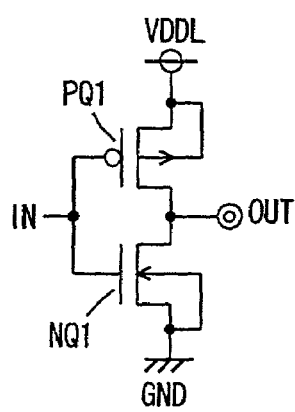
FIG. 37A shows an example of the construction of a logic element of a logic circuit shown in FIG. 36.
Figure 37B:
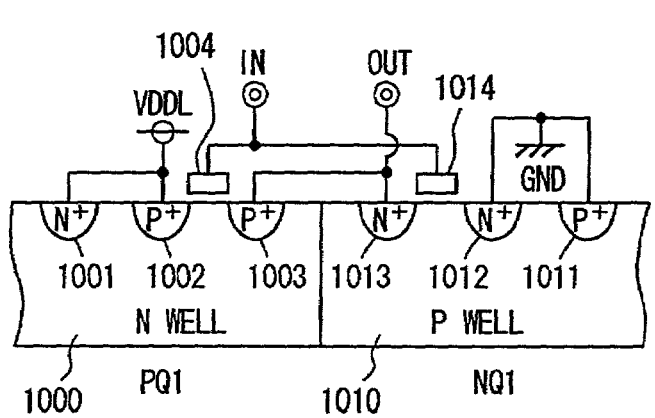
FIG. 37B is a schematic diagram showing the cross sectional structure of the logic circuit shown in FIG. 37A.
Figure 38A:
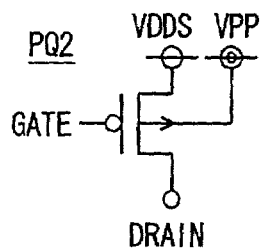
FIGS. 38A and 38B are schematic diagrams showing the connection of transistors on the memory array and the connection of transistors of a sense amplifier in a DRAM core shown in FIG. 36, respectively.
Figure 38B:
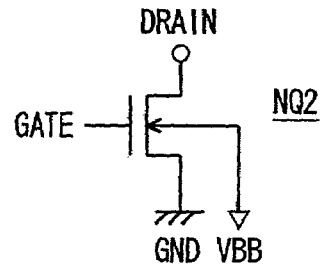
Figure 39:
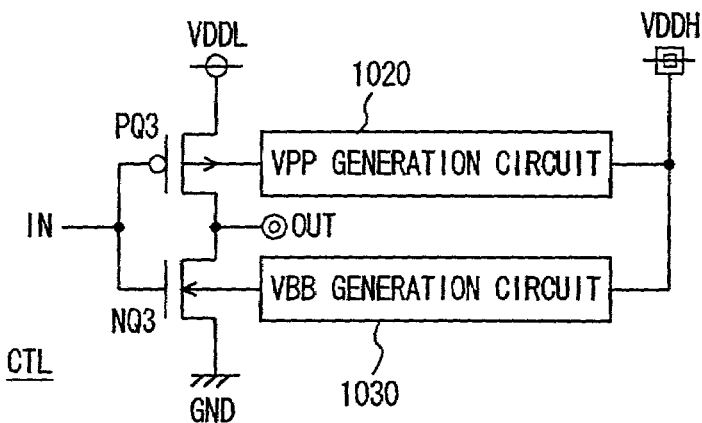
FIG. 39 shows voltages applied to the logic circuit of a control circuit in the conventional DRAM core.

FIG. 1 is a schematic diagram showing the construction of the main portion of a semiconductor device in the first embodiment according to the present invention. In FIG. 1, the construction of internal voltage generation circuit IVGA included in embedded DRAM macro DM as shown in FIG. 36 is shown. In FIG. 1, internal voltage generation circuit IVGA includes a VBB generation circuit 1 for VDDL which generates negative voltage VBB in accordance with logic power supply voltage VDDL, and a VBB generation circuit 12 for VDDH which generates negative voltage VBB in accordance with memory power supply voltage VDDH.

VBB generation circuits 1 and 2 are merely required to generate negative voltage VBB applied to the same region. Negative voltage VBB may be applied to the substrate region of memory array MA as shown in FIG. 36 and may be different in voltage level from a substrate bias voltage applied to memory array MA. What is necessary is that negative voltage VBB is applied to the back gate of the same low-Vth transistor included in control circuit CTL as the logic transistors in the logic LG. The back bias of an N channel MOS transistor is adjusted to increase the threshold voltage thereof while using negative voltage VBB.

As shown in FIG. 1, the circuits 1 and 2 generating negative voltage VBB in accordance with logic power supply voltage VDDL and memory power supply voltage VDDH, respectively, are provided as a circuit construction for generating negative voltage VBB. By providing the circuits 1 and 2, it is possible to generate negative voltage VBB irrespectively of a power up sequence of power supply voltage VDDL and VDDH. Even if logic power supply voltage VDDL is applied before memory power supply voltage VDDH, the voltage level of negative voltage VBB is set at a predetermined negative voltage level in accordance with logic power supply voltage VDDL.

Figure 40:
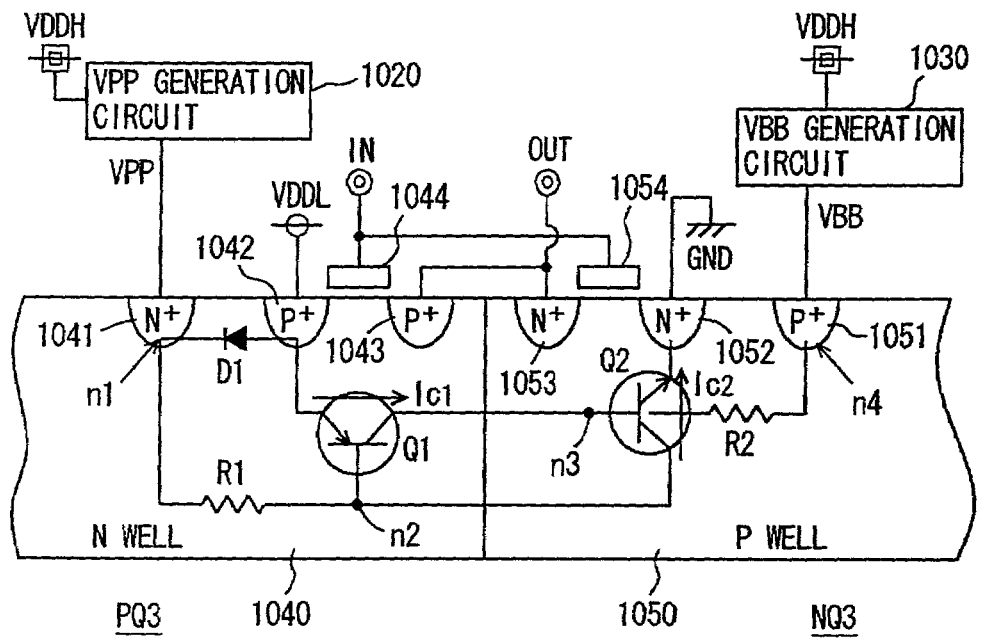
FIG. 40 is a schematic diagram showing the cross sectional structure of a CMOS inverter shown in FIG. 39.

In the case of the structure shown in FIG. 40, if P well 1050 is supplied with logic power supply voltage VDDL, negative voltage VBB is generated in accordance with logic power supply voltage VDDL and set to a predetermined voltage level. Thus, the base of parasitic bipolar transistor Q2 has a negative voltage level and the emitter thereof has a ground voltage level, thereby maintaining the base to emitter region of parasitic bipolar transistor Q2 in a reverse bias state. It is, therefore, possible to maintain parasitic bipolar transistor Q2 to be non-conductive. Thus, even if logic power supply voltage VDDL is applied before application of memory power supply voltage VDDH, the VBB generation node does not enter a floating state and the voltage level of the internal node n4 shown in FIG. 40 is driven to a negative voltage level, preventing a latch-up phenomenon from occurring.

Consequently, if a logic transistor is used for an N channel MOS transistor of the component of control circuit CTL and negative voltage VBB is applied to the back gate of the N channel MOS transistor, a threshold voltage can be increased. As can be seen, even if a logic transistor is used in the control circuit of DRAM macro, the back gate bias of the logic transistor can be increased and the absolute value of the threshold voltage thereof can be increased, making it possible to reduce manufacturing cost and consumption current.

[Second Embodiment]

Figure 2:
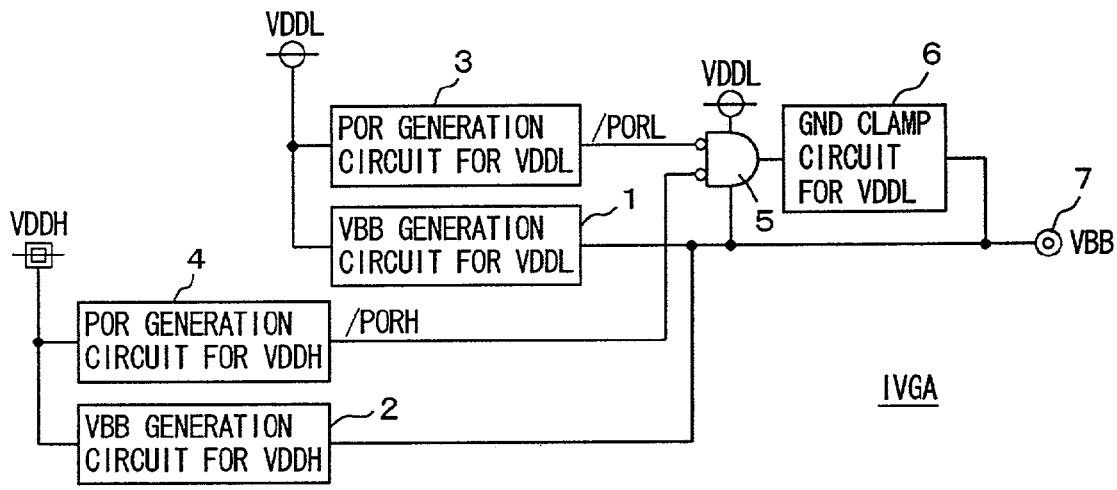
FIG. 2 is a schematic diagram showing the construction of a negative voltage generation circuit in a second embodiment according to the present invention.

FIG. 2 is a schematic diagram showing the construction of an internal voltage generation circuit in the second embodiment according to the present invention. In FIG. 2, internal voltage generation circuit IVGA includes the following components, in addition to VBB generation circuit 1 for VDDL and VBB generation circuit 2 for VDDH described in the first embodiment. Specifically, internal voltage generation circuit IVGA includes a POR generation circuit 3 for VDDL which detects the application of logic power supply voltage VDDL and generates a power on detection signal (power on reset signal) /PORL kept at L level or in an active state for a predetermined period of time, a POR generation circuit 4 for VDDH which detects the application of memory power supply voltage VDDH and generates a power on detection signal (power on reset signal)/PORH kept at an L level for a predetermined period of time when memory power supply voltage VDDH is applied or powered up, an NOR circuit 5 receiving power on detection signals /PORL and /PORH, and a GND clamp circuit 6 for VDDL which is rendered conductive, when the output signal of NOR circuit 5 is at an H level, for setting the voltage level of a negative voltage output node 7 at a ground voltage GND level. NOR circuit 5 is operated with logic power supply voltage VDDL and the voltage of node 7 as both operating power supply voltages.

If corresponding power supply voltages are applied, power on detection signals /PORL and /PORH are maintained at the L level, or in an active state until the corresponding power supply voltages reach the predetermined voltage levels or the corresponding power supply voltages are stabilized at the predetermined voltage levels. When being activated or at the L level, power on detection signals /PORL and /PORH prohibit the operations of circuits using power supply voltages VDDL and VDDH and initialize the internal nodes of these circuits, respectively. If power on detection signals /PORL and /PORH attain the H level, the circuits using source voltages VDDL and VDDH are allowed to operate.

VBB generation circuits 1 and 2 execute negative voltage generation operations if supplied with their corresponding power supply voltages, respectively. VBB generation circuits 1 and 2 perform charge pumping operations if their corresponding power supply voltages exceed the threshold voltage of MOS transistors related to the charge pumping operations. At this time, the charge pumping operations are unstable until the corresponding power supply voltages reach respective predetermined values. If the corresponding power supply voltages become equal to or higher than the predetermined values, VBB generation circuits 1 and 2 start charge pumping operations to decrease the voltage level of bias voltage VBB to a predetermined negative voltage level. By applying these corresponding power supply voltages and causing these circuits to perform the negative voltage generation operation, it is possible to prevent negative voltage VBB from rising up through capacitive coupling between a power source line and a negative voltage transmission line or between the power supply voltage supply node and the negative voltage supply node upon application of the corresponding power supply voltages.

If the levels of both power on detection signals (power on reset signals) /PORL and /PORH attain the L level, NOR circuit 5 activates GND clamp circuit 6 for VDDL and sets negative voltage VBB applied from a negative voltage output node 7 at the ground voltage GND level. If the level of one of power on detection signals /PORL and /PORH attains the H level, NOR circuit 5 outputs an L level signal to stop the clamp operation of GND clamp circuit 6 for VDDL. When power is up, the voltage level of negative voltage VBB is clamped to a predetermined voltage level. Therefore, in the following description, the voltage VBB will be referred to as bias voltage. Now, the operation of the internal voltage generation circuit shown in FIG. 2 will be described with reference to signal waveform diagrams shown in FIGS. 3 and 4.

Figure 3:
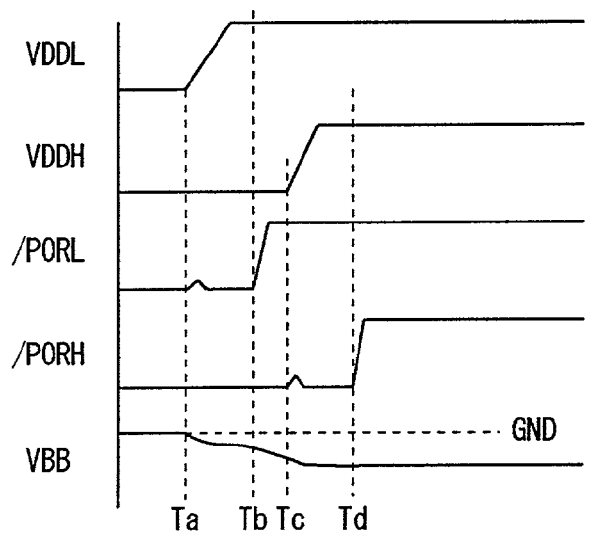
FIG. 3 is a signal waveform diagram representing an operation of the negative voltage generation circuit shown in FIG. 2.

As shown in FIG. 3, when logic power supply voltage VDDL is applied or is set up at time Ta and POR generation circuit 3 for VDDL raises the voltage level of power on detection signal /PORL in accordance with the rise of the voltage level of power supply voltage VDDL while the signal /PORL is in an initial state. Then, POR generation circuit 3 for VDDL fixes the voltage level of the signal /PORL to the L level for a predetermined period of time. If logic power supply voltage VDDL is stabilized, POR generation circuit 3 for VDDL raises the voltage level of logic power on detection signal /PORL to the H level to thereby release the circuits using logic power supply voltage VDDL from the reset state. In FIG. 3, after logic power supply voltage VDDL reaches a predetermined voltage level and stabilized in this state, logic power on detection signal /PORL is set at the H level at time Tb.

Before time Tb, NOR circuit 5 outputs an H level signal since both of power on detection signals /PORL and /PORH are at the H level. Between time Ta and time Tb, the voltage level of the output signal of NOR circuit 5 rises in accordance with the rise of the voltage level of logic power supply voltage VDDL. GND clamp circuit 6 for VDDL is made conductive in accordance with this voltage rise and fixes the level of voltage VBB applied from the node 7 to the ground voltage GND level.

On the other hand, if the level of logic power on detection signal /PORL rises to the H level at time Tb, NOR circuit 5 outputs an L level signal to stop the clamping operation of GND clamp circuit 6. At time Tb, power on detection signal /PORL returns from the L level to the H level, VBB generation circuit 1 for VDDL operates and effectively generates bias voltage VBB in accordance with stable logic power supply voltage VDDL. After time Tb, therefore, the level of bias voltage VBB from node 7 decreases to a predetermined negative voltage level at high speed.

When supplied with logic power supply voltage VDDL, VBB generation circuit 1 executes a negative voltage generation operation. Accordingly, in a voltage transient period or an initial period of the application or power up of logic power supply voltage VDDL, the circuit 1 performs an operation for insufficiently generating a negative voltage. Then, the circuit 1 effectively generates a negative voltage in accordance with stabilized logic power supply voltage VDDL. In this state, in an unstable, transient negative voltage generation period, clamp circuit 6 clamps the voltage level of negative voltage output node 7 to the ground voltage level, thereby reliably preventing the base to emitter region of parasitic bipolar transistor Q2 from being forwardly biased.

At time Tc, memory power supply voltage VDDH is applied and accordingly, the level of memory power on detection signal /PORH is fixed to the L level between time Tc and Td. During this period, while VBB generation circuit 2 for VDDH does not perform an effective negative voltage generation operation (instead performs an unstable charge pumping operation), VBB generation circuit 1 for VDDL has already generated negative voltage VBB effectively.

During the period from time Ta to time Tb, ground voltage GND is applied to impurity region 1051 (internal node n4)

shown in FIG. 40. Thus, even if VPP generation circuit 1020 shown in FIG. 40 is in an output high impedance state and parasitic bipolar transistor Q1 is made conductive in N well 1040, the level of P well 1050 is fixed to the ground voltage level and node n3 is, therefore, at the ground potential level. It is, therefore, possible to prevent the base to emitter region of parasitic bipolar transistor Q2 from being forwardly biased.

That is, it is possible to prevent negative voltage output node 7 from entering a high impedance state until the power supply voltage is stabilized and negative bias voltage VBB is stably generated. Accordingly, the voltage level of impurity region 1051 in P well shown in FIG. 40 rises to prevent parasitic bipolar transistor Q2 from becoming conductive. As a result, even if logic power supply voltage VDDL is applied before power up of memory power supply voltage VDDH, it is possible to reliably prevent a latch-up phenomenon from occurring.

If memory power supply voltage VDDH is applied before power up of logic power supply voltage VDDL, there is a period in which both power on detection signals /PORL and /PORH attain the L level. In this case, NOR circuit 5 is supplied with, as an operating power supply voltage, logic power supply voltage VDDL, the output signal of NOR circuit 5 is at the L level and GND clamp circuit 6 for VDDL does not perform a clamp operation. In this case, however, if memory power supply voltage VDDH is applied and the level of memory power on detection signal /PORH attains the H level, VBB generation circuit 2 for VDDH performs a stable charge pumping operation and thereby drives the bias voltage VBB to a predetermined negative voltage level. Thus, VBB generation circuit 2 for VDDH performs a charge pumping operation unstably in response to the application of memory power supply voltage VDDH. Even if there is a period in which negative voltage output node 7 enters a floating state until logic power supply voltage VDDL is supplied and VBB generation circuit 2 for VDDH starts a charge pumping operation, this power up sequence of the power supply voltages is a voltage application sequence in which no latch-up phenomenon occurs and parasitic bipolar transistor Q2 is maintained non-conductive, making it possible to reliably suppress the latch-up phenomenon.

Figure 4:
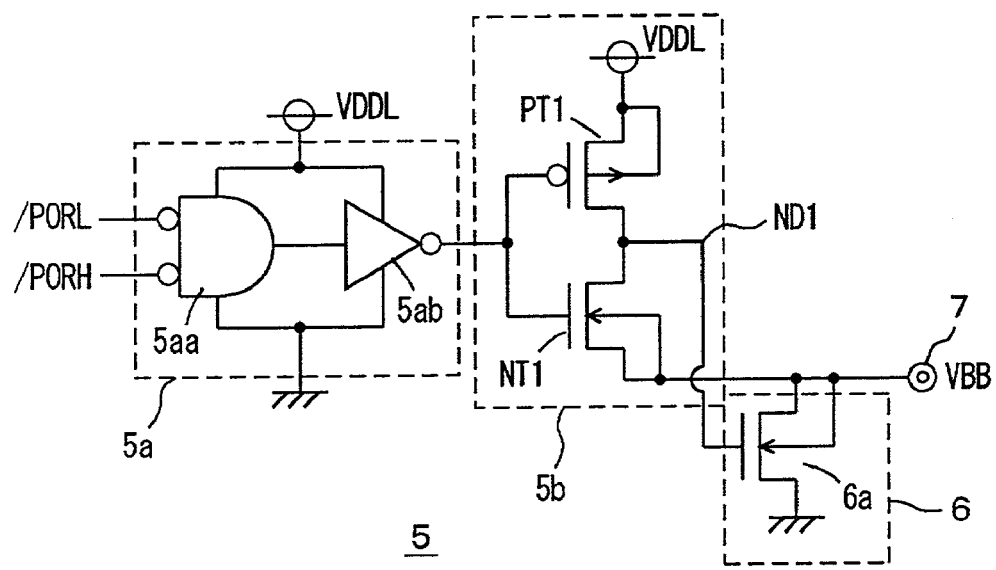
FIG. 4 shows an example of the specific constructions of an NOR circuit and a GND clamp circuit for VDDL shown in FIG. 2.

FIG. 4 shows an example of the constructions of NOR circuit 5 and GND clamp circuit 6 for VDDL shown in FIG. 2. In FIG. 4, NOR circuit 5 includes an OR circuit 5a receiving power on detection signals /PORL and /PORH, and a level conversion circuit 5b converting the level of the output signal of OR circuit 5a. OR circuit 5a receives power supply voltage VDDL and the ground voltage as both operating power supply voltages, for operation. Level conversion circuit 5b receives logic power supply voltage VDDL and internal voltage VBB on output node 7 as both operating power supply voltages and converts the voltage level of the output signal of OR circuit 5a.

OR circuit 5a includes an NOR gate 5aa receiving power on detection signals /PORL and /PORH and an inverter 5ab inverting the output signal of NOR gate 5aa. NOR gate 5aa and inverter 5ab are supplied with logic power supply voltage VDDL as an operating power supply voltage.

Level conversion circuit 5b includes a P channel MOS transistor PT1 connected between a logic power source node and a node ND1 and having a gate receiving the output signal of OR circuit 5a, and an N channel MOS transistor NT1 connected between node ND1 and node 7 and receiving, at a gate thereof, the output signal of OR circuit 5a. The back gate and the source of P channel MOS transistor PT1 are connected to the logic power source node, and the back gate and the source of N channel MOS transistor NT1 are connected to output node 7.

GND clamp circuit 6 for VDDL includes an N channel MOS transistor 6a connected between negative voltage output node 7 and the ground node, having a back gate connected to negative voltage output node 7 and having a gate connected to node ND1. The operations of the circuits shown in FIG. 4 will now be described with reference to the signal waveform diagrams shown in FIGS. 5 and 6.

Figure 5:
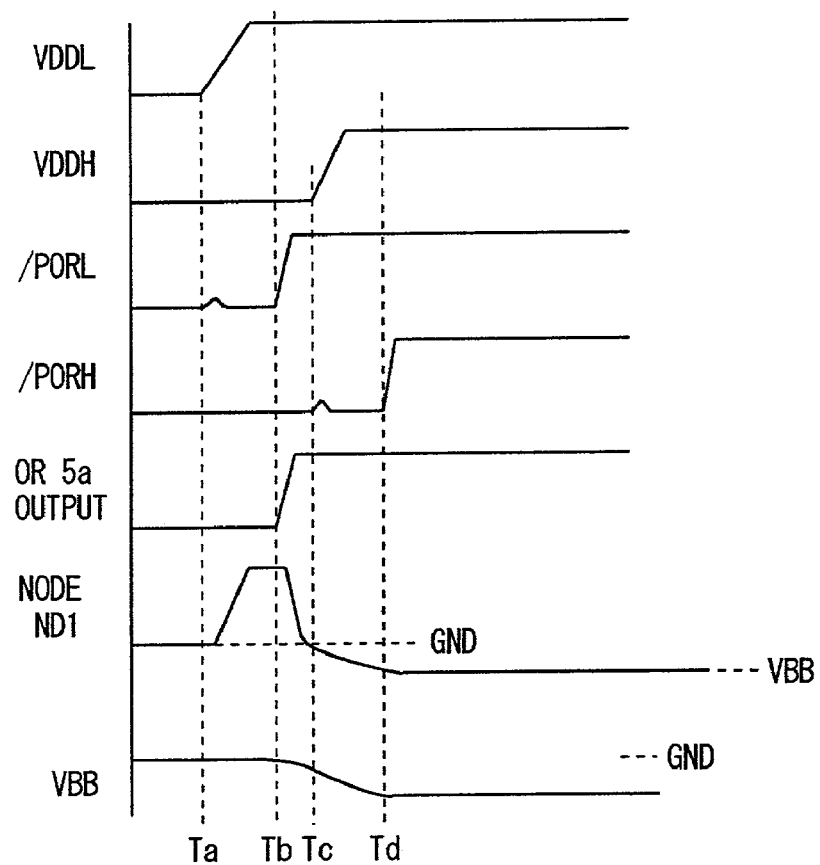
FIG. 5 is a signal waveform diagram representing an operation of the circuits shown in FIG. 4.

Referring first to FIG. 5, description will be given to the operations of the circuits shown in FIG. 4 in the case where logic power supply voltage VDDL is applied before power up of memory power supply voltage VDDH.

In FIG. 5, at time Ta, logic power supply voltage VDDL is applied or powered up, and the voltage level of logic power supply voltage VDDL rises. Between time Ta and time Tb, logic power on detection signal /PORL is maintained at a logic L level. Likewise, since memory power supply voltage VDDH is not applied yet, memory power on detection signal /PORH is at the L level. In a period from time Ta to time Tb, therefore, the output signal of OR circuit 5a is at the L level. Accordingly, in level conversion circuit 5b, P channel MOS transistor PT1 is rendered conductive, the voltage level of node ND1 rises according to the rise of logic power supply voltage VDDL and the voltage level of node ND1 is stabilized at the H level according to the stabilization of logic power supply voltage VDDL.

If the voltage level of node ND1 exceeds the threshold voltage level of clamping N channel MOS transistor 6a, MOS transistor 6a is rendered conductive, negative voltage output node 7 is coupled to the ground node and the voltage level of bias voltage VBB of negative voltage output node 7 is fixed to the ground voltage GND level.

If logic power on detection signal /PORL is applied, VBB generation circuit 1 for VDDL operates and drives the level of substrate bias voltage VBB to a predetermined negative voltage level. VBB generation circuit 1 for VDDL generates a negative voltage in accordance with logic power supply voltage VDDL and generates, though unstably, a negative voltage even at the transient period of logic power supply voltage VDDL. In this period, the oscillation operation of an oscillation circuit and others in the circuit 1 are unstable, so that VBB generation circuit 1 does not perform an effective negative voltage generation operation, i.e., the circuit 1 is in a transient state. If logic power supply voltage VDDL is stabilized, VBB generation circuit 1 for VDDL effectively generates a negative voltage.

At time Tb, if the level of logic power on detection signal /PORL rises to the H level, the output signal of OR circuit 5a attains the H level. Accordingly, in level conversion circuit 5b, P channel MOS transistor PT1 is turned off and N channel MOS transistor NT1 is turned on. As a result, the voltage level of output node ND1 of level conversion circuit 5b becomes equal to the voltage level of bias voltage VBB on negative voltage output node 7 and clamping MOS transistor 6a is turned off, whereby the level of bias voltage VBB is driven to a lower negative voltage level than ground voltage GND.

At time Tc, memory power supply voltage VDDH is applied. At time Td, the level of memory power on detection signal /PORH rises to the H level. Even when the power on detection signal /PORH is raised to H level, the above-described state (the state at Time Tb) remains unchanged.

Accordingly, if logic power supply voltage VDDL is applied first, the voltage level of bias voltage VBB at negative voltage output node 7 is fixed to the ground voltage level until VBB generation circuit 1 for VDDL effectively generates a negative voltage, thereby preventing negative voltage output node 7 from entering a high impedance state.

Figure 6:
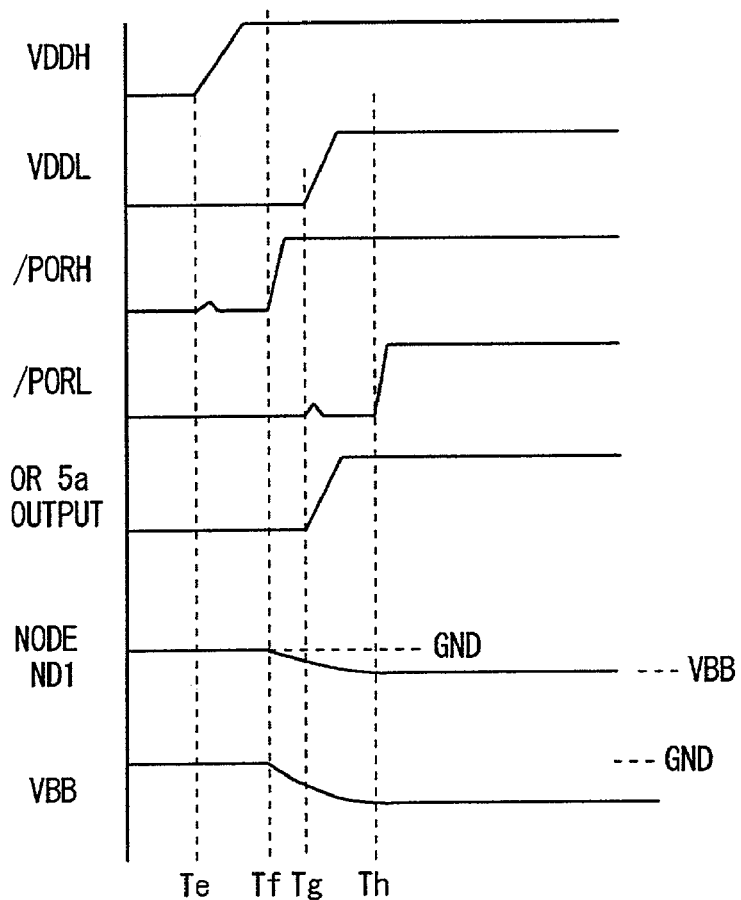
FIG. 6 is a signal waveform diagram representing an operation of the circuits shown in FIG. 4.

Next, referring to FIG. 6, description will be given to the operations of the circuits shown in FIG. 4.

At time Te, memory power supply voltage VDDH is applied or powered up. At time Tf, the level of memory power on detection signal /PORH rises to the H level. If the level of memory power on detection signal /PORH attains the H level, VBB generation circuit 2 for VDDH shown in FIG. 2 effectively operates, or stably performs an oscillation operation and a charge pumping operation and generates a negative voltage, and drives the bias voltage from negative voltage output node 7 from the ground voltage GND level to a predetermined negative voltage level.

In a period from time Te to time Tf, power on detection signals /PORH and /PORL are at the L level. However, since logic power supply voltage VDDL is not applied yet, the output signal of OR circuit 5a is at the L level. Also, since logic power supply voltage VDDL is not applied to level conversion circuit 5b yet, the voltage of node ND1 is at the L level.

In this state, negative voltage output node 7 is supplied with the output voltage of VBB generation circuit 2 for VDDH shown in FIG. 2 to decrease the voltage level of bias voltage VBB on negative voltage output node 7. Accordingly, if the voltage level of substrate bias voltage VBB from negative voltage output node 7 becomes lower than an inverted value of the threshold voltage level of MOS transistor NT1, N channel MOS transistor NT1 is turned on even though the gate thereof is at the ground voltage level. Then, the voltage of negative voltage output node 7 is transmitted to node ND1 and the voltage level of node ND1 decreases according to the decrease of the voltage level of bias voltage VBB.

In this state, therefore, the gate and the source of clamping MOS transistor 6a in GND clamp circuit 6 for VDDL are at the same voltage level and MOS transistor 6a is maintained non-conductive. Clamping MOS transistor 6a exerts, therefore, no influence on the negative voltage generation operation of VBB generation circuit 2 for VDDH.

At time Tg, logic power supply voltage VDDL is applied or powered up. At Time Th, the level of logic power on detection signal /PORL rises to the H level. When logic power supply voltage VDDL is applied, VBB generation circuit 2 for VDDH already operates stably and negative voltage output node 7 is driven by VBB generation circuit 2 for VDDH and does not enter a floating state. In this state, therefore, no latch-up phenomenon occurs even if logic power supply voltage VDDL is applied.

If memory power supply voltage VDDH is applied first, clamping transistor 6a is turned off. Even if negative voltage output node 7 enters a floating state until VBB generation circuit 2 for VDDH starts a charge pumping operation, though unstably, in accordance with memory power supply voltage VDDH, it is possible to prevent the thyristor operation of the parasitic bipolar transistors by applying memory power supply voltage VDDH before application of logic power supply voltage VDDL.

When logic power supply voltage VDDL is applied before application of memory power supply voltage VDDH, substrate bias voltage VBB is clamped to the ground voltage GND level until VBB generation circuit 1 for VDDL effectively starts a negative voltage generation operation in the transient period of logic power supply voltage VDDL or after logic power supply voltage VDDL is stabilized. Thus, the bias voltage VBB is prevented from entering a floating state to prevent the voltage level of bias voltage VBB from rising up. As a result, it is possible to reliably prevent the occurrence of a latch-up phenomenon.

[Modification]

Figure 7:
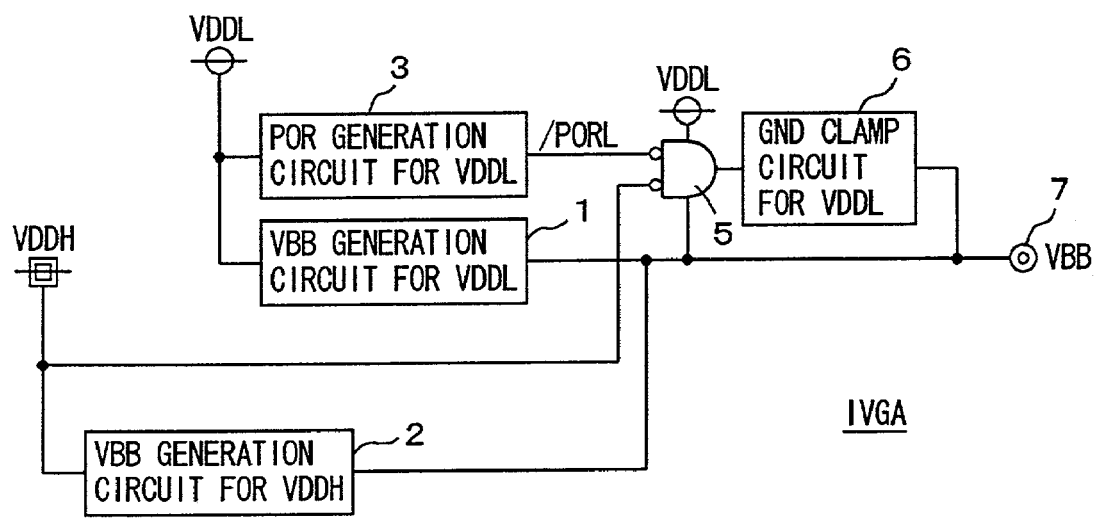
FIG. 7 is a schematic diagram showing the construction of a negative voltage generation circuit in a modification of the second embodiment according to the present invention.

FIG. 7 is a block diagram showing the construction of the modification of the second embodiment according to the present invention. With the construction shown in FIG. 7, memory power supply voltage VDDH is applied, as memory power on detection signal /PORH, to NOR circuit 5. The other construction is the same as that shown in FIG. 2. Therefore, corresponding constituent elements are denoted by the same reference numerals as those in FIG. 2 and detailed description thereof will not be given thereto.

In the construction shown in FIG. 7, memory power supply voltage VDDH is higher in voltage level than logic power supply voltage VDDL, and therefore, NOR circuit 5 can accurately perform a logic operation.

If logic power supply voltage VDDL is applied first, the voltage level of negative voltage output node 7 is fixed to the ground voltage level by GND clamp circuit 6 for VDDL in a transient period before VBB generation circuit 1 for VDDL stably generates bias voltage VBB. This is because memory power supply voltage VDDH is at the ground voltage level.

On the other hand, if memory power supply voltage VDDH is applied before application of logic power supply voltage VDDL, GND clamp circuit 6 for VDDL is maintained non-conducive in accordance with the rise of the voltage level of memory power supply voltage VDDH. Then, VBB generation circuit 2 for VDDH operates and decreases the voltage level of bias voltage VBB. Accordingly, in a transient period since memory power supply voltage VDDH is applied until VBB generation circuit 2 for VDDH stably operates, negative voltage output node 7 is in an unstable state. However, since logic power supply voltage VDDL is not applied yet, no latch-up phenomenon occurs even if negative voltage output node 7 is set in such an unstable state.

As stated above, according to the second embodiment of the present invention, the semiconductor device is so constituted as to clamp the voltage level of the substrate bias voltage connection node to the ground voltage level when both the memory power on detection signal and the logic power on detection signal are active. It is, therefore, possible to reliably suppress the substrate bias voltage output node from entering a floating state in a transient period before a negative voltage generation operation starts. Thus, even if logic power supply voltage VDDL is applied before memory power supply voltage VDDH, it is possible to ensure preventing a latch-up phenomenon from occurring.

[Third Embodiment]

Figure 8:
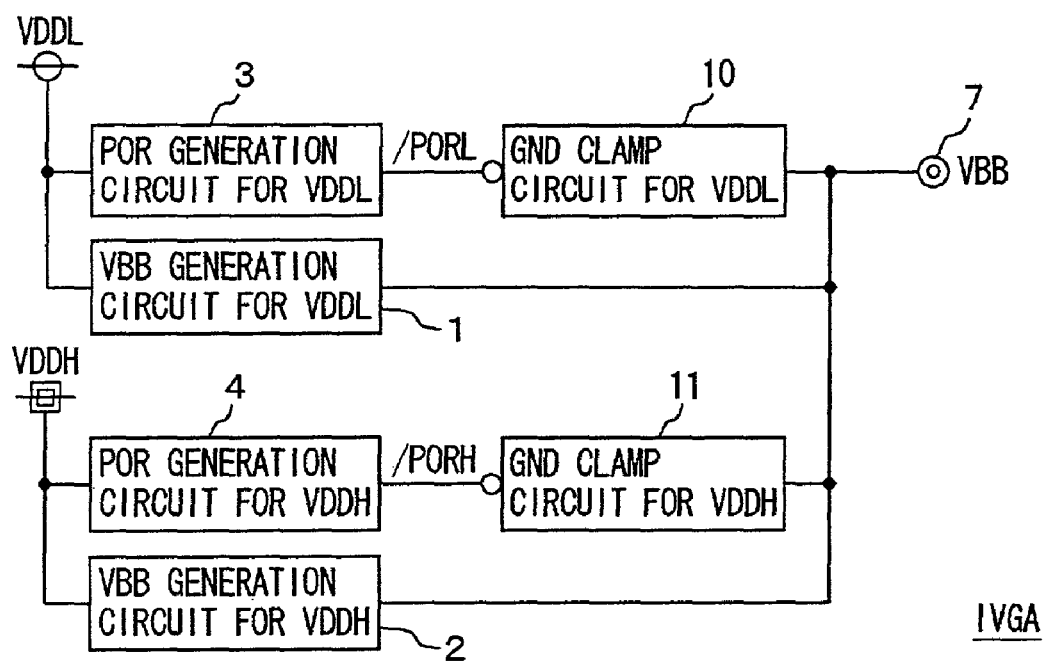
FIG. 8 is a schematic diagram showing the construction of a negative voltage generation circuit in a third embodiment according to the present invention.

FIG. 8 is a schematic diagram showing the construction of an internal voltage generation circuit in the third embodiment according to the present invention. In the construction shown in FIG. 8, the internal voltage generation circuit includes a GND clamp circuit 10 for VDDL which clamps the voltage level of negative voltage output node 7 to the ground voltage level in accordance with logic power on detection signal /PORL applied from POR generation circuit 3 for VDDL, and a GND clamp circuit 11 for VDDH which clamps the voltage level of substrate bias voltage output node 7 to the ground voltage level in accordance with memory power on detection signal /PORH applied from POR generation circuit 4 for VDDH. Namely, in the construction shown in FIG. 8, GND clamp circuits for clamping the voltage level of the negative voltage output node 7 to the ground voltage level in accordance with logic power supply voltage VDDL and memory power supply voltage VDDH, respectively are provided.

GND clamp circuit 10 for VDDL is supplied with logic power supply voltage VDDL as an operating power supply voltage. If logic power on detection signal /PORL is at the L level, GND clamp circuit 10 for VDDL clamps the voltage level of negative voltage output node 7 to the ground voltage GND level. On the other hand, if memory power on detection signal /PORH is at the L level, GND clamp circuit 11 for VDDH clamps the voltage level of negative voltage output node 7 to the ground voltage level.

With the construction shown in FIG. 8, therefore, even if memory power supply voltage VDDH is applied before application of logic power supply voltage VDDL, the voltage level of substrate bias voltage VBB is clamped to the ground voltage GND level until VBB generation circuit 2 effectively starts a negative voltage generation operation in the transient period of memory power supply voltage VDDH, thereby preventing a latch-up phenomenon from occurring due to noise or the like. It is, therefore, possible to further reliably suppress a latch-up phenomenon irrespectively of the power up sequence of the power supply voltages.

It is noted that VBB generation circuits 1 and 2 execute negative voltage generation operations in accordance with the application of corresponding power supply voltages and that the same is true for the subsequent embodiments unless specified otherwise.

Figure 9:
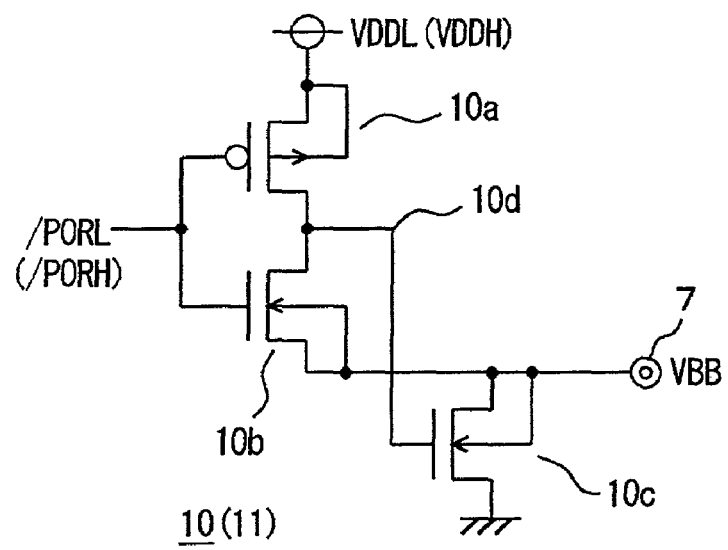
FIG. 9 shows an example of the construction of a GND clamp circuit shown in FIG. 8.

FIG. 9 shows an example of the construction of GND clamp circuit 10 for VDDL and GND clamp circuit 11 for VDDH shown in FIG. 8. The constructions of clamp circuits 10 and 11 are the same except for their respective operating power supply voltages. In FIG. 8, therefore, the construction of GND clamp circuit 10 for VDDL is typically shown.

In FIG. 9, GND clamp circuit 10 for VDDL includes a P channel MOS transistor 10a connected between the logic power source node and an internal node 10d and having a gate receiving logic power on detection signal /PORL, an N channel MOS transistor 10b connected between internal node 10d and negative voltage output node 7 and having a gate receiving logic power on detection signal /PORL, and an N channel MOS transistor 10c connected between negative output node 7 and the ground node and having a gate connected to internal node 10d. MOS transistor 10a has a back gate connected to the logic power source node. Each of MOS transistors 10b and 10c has a back gate connected to negative voltage output node 7.

If logic power supply voltage VDDL is applied before application of memory power supply voltage VDDH, logic power on detection signal /PORL is kept at the L level for a predetermined period of time. In this state, MOS transistor 10a is turned on and the internal node 10d is driven to a logic power supply voltage VDDL level. Accordingly, MOS transistor 10c is turned on and the voltage level of negative voltage output node 7 is fixed to the ground voltage level.

If logic power on detection signal /PORL attains the H level, MOS transistor 10a is turned off, MOS transistor 10b is turned on and the voltage level of internal node 10d is maintained at the voltage level of negative voltage output node 7. Accordingly, clamping MOS transistor 10c is turned off, and VDD generation circuit 1 for VDDL effectively performs a negative voltage generation operation to decrease the voltage level of substrate bias voltage VBB.

On the other hand, if memory power supply voltage VDDH is applied before application of logic power supply voltage VDDL, logic power on detection signal /PORL is at the L level and logic power supply voltage VDDL is also at the L level (ground voltage level). In this state, if VBB generation circuit 2 for VDDH starts a negative voltage generation operation in accordance with memory power supply voltage VDDH, the voltage level of bias voltage VBB is decreased. If the voltage level of bias voltage VBB is decreased and MOS transistor 10b has a gate to source voltage attaining to or higher than the threshold voltage thereof, MOS transistor 10b is turned on and bias voltage VBB is transmitted to internal node 10d. Accordingly, clamping MOS transistor 10c is maintained non-conductive and MOS transistor 10c exerts no influence on the negative voltage generation operation of VBB generation circuit 2 for VDDH.

As described above, irrespectively of the sequence of applying logic power supply voltage VDDL and memory power supply voltage VDDH, GND clamp circuits 10 and 11 can reliably maintain negative output node 7 at the ground voltage level from the transient period of the power supply voltage applied first until a negative voltage generation operation is effectively started and reliably suppresses a latch-up phenomenon.

It is noted that the construction of GND clamp circuit 11 for VDDH is obtained by employing memory power on detection signal /PORH in place of logic power on detection signal /PORL and employing memory power supply voltage VDDH in place of logic power supply voltage VDDL as indicated by parentheses in FIG. 9.

As stated so far, according to the third embodiment of the present invention, GND clamp circuits are provided for logic power supply voltage VDDL and for memory power supply voltage VDDH, respectively, and the GND clamp circuits can reliably fixes the voltage level of negative voltage output node to the ground voltage level from the transient period of the power supply voltage applied first until a negative voltage is effectively generated. It is, therefore, possible to prevent the negative voltage output node from entering a floating state and to prevent the base to emitter region of the parasitic bipolar transistor from being forwardly biased. Thus, irrespectively of the power up sequence of the power supply voltages, it is possible to reliably suppress a latch-up phenomenon from occurring.

[Fourth Embodiment]

Figure 10:
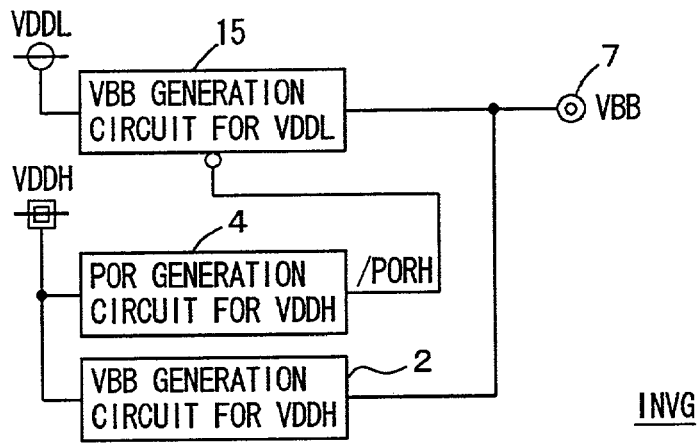
FIG. 10 is a schematic diagram showing the construction of a negative voltage generation circuit in a fourth embodiment according to the present invention.

FIG. 10 is a schematic diagram showing the construction of a negative voltage generation circuit in the fourth embodiment according to the present invention. In the construction of the negative voltage generation circuit shown in FIG. 10, a VBB generation circuit 15 for VDDL which generates a negative voltage in accordance wit logic power supply voltage VDDL is operative only when memory power on detection signal /PORH from POR generation circuit 4 for VDDH is at the L level. If memory power on detection signal /PORH attains the H level, the negative voltage generation operation of VBB generation circuit 15 for VDDL is stopped. In that case, VBB generation circuit 2 for VDDH which generates a negative voltage in accordance with memory power supply voltage VDDH performs a negative voltage generation operation. VBB generation circuit 2 for VDDH performs the negative voltage generation operation in accordance with memory power supply voltage VDDH.

If logic power supply voltage VDDL is applied before application of memory power supply voltage VDDH, memory power on detection signal /PORH is maintained at the L level. Thus, VBB generation circuit 15 for VDDL operates and generates a negative voltage onto negative voltage output node 7. In this case, even if logic power supply voltage VDDL is applied before application of memory power supply voltage VDDH, bias voltage VBB is driven to the negative voltage level and negative voltage output node 7 does not enter a floating state, thereby suppressing a latch-up phenomenon.

If memory power supply voltage VDDH is applied next, the level of memory power on detection signal /PORH applied from POR generation circuit 4 for VDDH attains the H level after the elapse of a predetermined period of time. Accordingly, the negative voltage generation operation of VBB generation circuit 15 for VDDL is stopped. On the other hand, VBB generation circuit 2 for VDDH effectively executes a negative voltage generation operation.

Consequently, both VBB generation circuit 15 for VDDL and VBB generation circuit 2 for VDDH operate, thereby preventing the voltage level of substrate bias voltage VBB from attaining an unnecessarily high voltage level and preventing unnecessary power consumption. Besides, in a standby state, only VBB generation circuit 2 for VDDH operates, so that standby current can be reduced.

Figure 11:
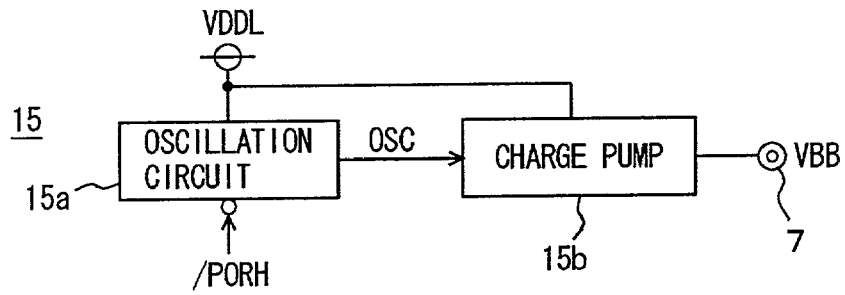
FIG. 11 is a schematic diagram showing an example of the construction of a VBB generation circuit for VDDL shown in FIG. 10.

FIG. 11 is a schematic diagram showing an example of the construction of VBB generation circuit 15 for VDDL shown in FIG. 10. In FIG. 11, VBB generation circuit 15 for VDDL includes an oscillation circuit 15*a* receiving logic power supply voltage VDDL as an operating power supply voltage and performing an oscillation operation if memory power on detection signal /PORH is at the L level, and a charge pump 15*b* performing a charge pumping operation in accordance with an oscillation signal OSC outputted from oscillation circuit 15*a* and generating a negative voltage onto negative voltage output node 7. Charge pump 15 receives logic power supply voltage VDDL as an operating power supply voltage as oscillation circuit 15*a* receives.

Oscillation circuit 15*a* is constituted of, for example, a ring oscillator having odd-number stages of inverters interconnected in a ring fashion. An NOR circuit receiving memory power on detection signal /PORH and the output signal of the inverter in the last stage is employed in place of the inverter at the first stage. If memory power on detection signal /PORH attains the H level, the level of the output signal of the NOR circuit in the first stage is fixed to the L level and the oscillation operation of the ring oscillator is stopped.

As stated so far, according to the fourth embodiment of the present invention, the circuit generating a negative voltage in accordance with the logic power supply voltage is made operable only when the memory power on detection signal is active, thereby making it possible to prevent a substrate bias from increasing and to reduce current consumption.

[Fifth Embodiment]

Figure 12:
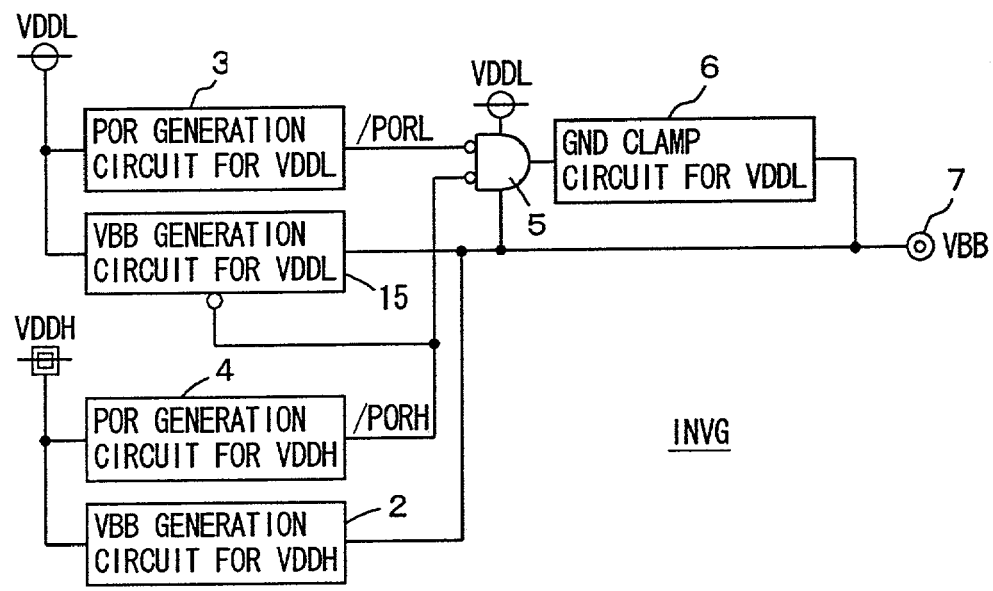
FIG. 12 is a schematic diagram showing the construction of a negative voltage generation circuit in a fifth embodiment according to the present invention.

FIG. 12 is a schematic diagram showing the construction of a negative voltage generation circuit included in internal voltage generation circuit INVG in the fifth embodiment according to the present invention. In the construction of the negative voltage generation circuits shown in FIG. 12, VBB generation circuit 15 for VDDL shown in FIG. 10 is employed in place of VBB generation circuit 1 for VDDL included in the negative voltage generation circuit shown in FIG. 2. The remaining construction of the negative voltage generation circuit shown in FIG. 12 is the same as that of the negative voltage generation circuit shown in FIG. 2. Therefore, corresponding components are denoted by the same reference numerals as those in FIG. 2 and detailed description thereof will not be given thereto.

In the construction of the negative voltage generation circuits shown in FIG. 12, VBB generation circuit 15 for VDDL is enabled to generate negative voltage VBB only when power on reset signal (power on detection signal) /PORH from POR generation circuit 4 for VDDH is at the L level. If power on detection signal /PORH attains the H level, the operation of VBB generation circuit 15 for VDDL is stopped and VBB generation circuit 2 for VDDH starts a negative voltage generation operation. VBB generation circuit 2 for VDDH executes the negative voltage generation operation in accordance with memory power supply voltage VDDH. In the case of the construction shown in FIG. 12, therefore, it is possible to obtain the effect of the negative voltage generation circuit shown in FIG. 10, in addition to that of the negative voltage generation circuit shown in FIG. 2.

[Sixth Embodiment]

Figure 13:
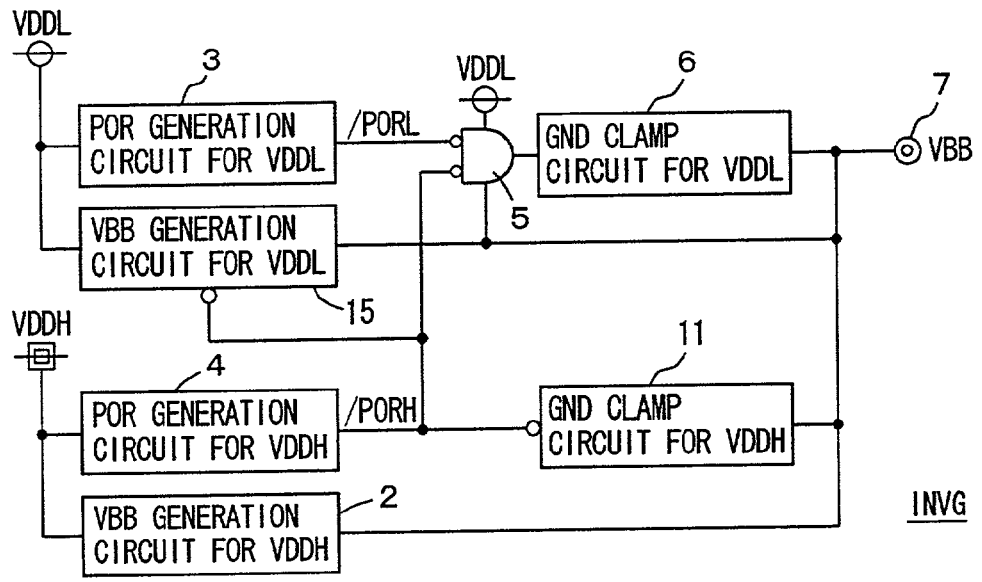
FIG. 13 is a schematic diagram showing the construction of a negative voltage generation circuit in a sixth embodiment according to the present invention.

FIG. 13 is a schematic diagram showing the construction of a negative voltage generation circuit in the sixth embodiment according to the present invention. The negative voltage generation circuit is included in internal voltage generation circuit INVG as in the case of the preceding first to fifth embodiments.

In the construction of the negative voltage generation circuit shown in FIG. 13, GND clamp circuit 11 for VDDH that clamps the voltage level of negative voltage output node 7 to the ground voltage level in response to power on detection signal /PORH from POR generation circuit 4 for VDDH is added to the construction of the negative voltage generation circuit shown in FIG. 12. The remaining construction of the negative voltage generation circuit shown in FIG. 13 is the same as that of the negative voltage generation circuit shown in FIG. 12. Therefore, corresponding components are denoted by the same reference numerals as those in FIG. 12 and detailed description thereof will not be given thereto.

The construction of GND clamp circuit 11 for VDDH is the same as GND clamp circuit 11 for VDDH shown in FIG. 8 and the specific construction thereof is implemented by using the same construction as that shown in FIG. 9.

In the case of the construction of the negative voltage generation circuit shown in FIG. 13, if both of power supply voltage application detection circuits /PORL and /PORH are active, GND clamp circuit 6 for VDDL clamps the voltage level of negative voltage output node 7 to the ground voltage level. On the other hand, if memory power on detection signal /PORH is at the L level, GND clamp circuit 11 for VDDH clamps the voltage level of negative voltage output node 7 to the ground voltage level. Therefore, irrespectively of the sequence of power up of power supply voltages VDDL and VDDH, the level of negative voltage output node 7 is fixed to the ground voltage level by GND clamp circuit 6 for VDDL or GND clamp circuit 11 for VDDH in a transient period immediately after the power supply voltage VDDL or VDDH is applied, thereby preventing negative voltage output node 7 from entering a floating state or an unstable voltage state.

Consequently, it is possible to reliably prevent negative voltage output node 7 from entering a floating state in the transient period of the application of a power supply voltage irrespectively of the power up sequence of the power supply voltages, to prevent the base to emitter region of the parasitic bipolar transistor from being forwardly biased and to suppress a latch-up phenomenon from occurring.

Further, if memory power supply voltage VDDH is applied and stabilized and memory power on detection signal /PORH attains the H level, VBB generation circuit 15 for VDDL is maintained in an inactive state. As in the case of the preceding fourth and fifth embodiments, therefore, it is possible to reduce current consumption, to prevent substrate bias voltage VBB from being driven to an unnecessarily low voltage level and to further reduce current consumption accordingly.

Moreover, if memory power supply voltage VDDH is applied first, VBB clamp circuit 11 for VDDH clamps the voltage level of negative voltage output node 7 to the ground voltage level. If logic power supply voltage VDDL is applied first, the level of logic power on detection signal /PORL rises to the H level after the elapse of a predetermined period of time and the clamp operation of clamp circuit 6 for VDDL is completed. In response to the application of memory power supply voltage VDDH, the level of memory power on detection signal /PORH is kept at the L level for a predetermined period of time and GND clamp circuit 11 for VDDH performs a damp operation.

VBB generation circuit 15 for VDDL generates a negative voltage and through-current flows through GND clamp circuit 1 for VDDH. However, it is possible to sufficiently decrease the through-current in clamp circuit 11 by lowering the charge supply capability of VBB generation circuit 15 for VDDL. If memory power on detection signal /PORH rises to the H level, the negative voltage generation operation of VBB generation circuit 15 for VDDH is stopped. At the same time, the clamp operation of GND clamp circuit 11 for VDDH is stopped. As a result, VBB generation circuit 2 for VDDH stably generates a negative voltage.

With this construction, as in the case of the above embodiments, it is possible to prevent negative voltage output node 7 from entering a floating state in the transient time of the application of a power supply voltages and to prevent a latch-up phenomenon from occurring.

[Modification]

Figure 14:
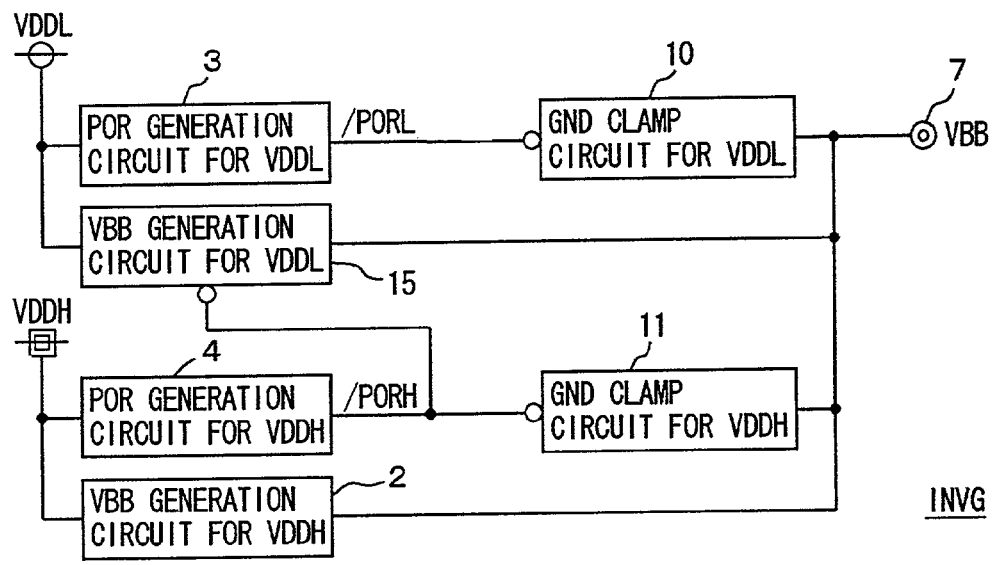
FIG. 14 is a schematic diagram showing the construction of a modification of the sixth embodiment according to the present invention.

FIG. 14 is a schematic diagram showing the construction of the modification of the negative voltage generation circuit in the sixth embodiment according to the present invention. The negative voltage generation circuit shown in FIG. 14 differs from that shown in FIG. 8 in the following points. VBB generation circuit 15 for DDL is employed in place of the VBB generation circuit 1. BB generation circuit 15 for VDDL is enabled when memory power on detection signal /PORH is at the L level, and generates a negative voltage after logic power supply voltage VDDL is applied. The other construction of the negative voltage generation circuit shown in FIG. 14 is the same as that shown in FIG. 12. Therefore, corresponding components are denoted by the same reference numerals as those in FIG. 12 and detailed description thereof will not be given thereto.

In the construction of the negative voltage generation circuit shown in FIG. 14, if logic power supply voltage VDDL is applied first, GND clamp circuit 10 for VDDL clamps the voltage level of negative voltage output node 7 to the ground voltage level for a predetermined period, for which logic power on detection signal /PORL is in an active state. On the other hand, if memory power supply voltage VDDH is applied first, GND clamp circuit 11 for VDDH clamps the voltage level of negative voltage output node 7 to the ground voltage level while memory power on detection signal /PORH is in an active state or at L level.

Accordingly, irrespectively of the power supply voltage application sequence, it is possible to prevent negative voltage output node 7 from entering a floating state, to prevent the base to emitter region of parasitic bipolar transistor Q2 from being forwardly biased and to reliably suppress a latch-up phenomenon. Further, if memory power on detection signal /PORH attains the H level, VBB generation circuit 15 for VDDL is prohibited from performing a negative voltage generation operation, which can reduce current consumed for generating the negative voltage and reduce standby current accordingly.

As stated so far, according to the sixth embodiment of the present invention, the voltage level of the negative voltage output node is fixed (clamped) to the ground voltage level in the transient period in which the power supply voltage is changed. Besides, if the memory power supply voltage is stabilized, the operation of the VBB generation circuit for VDDL is stopped, whereby it is possible to reliably suppress a latch-up phenomenon irrespectively of the power up sequence of the power supply voltages and to reduce consumption current. In addition, it is possible to prevent the substrate bias voltage VBB from being driven to a higher negative potential level and to further reduce current consumption accordingly.

[Seventh Embodiment]

Figure 15:
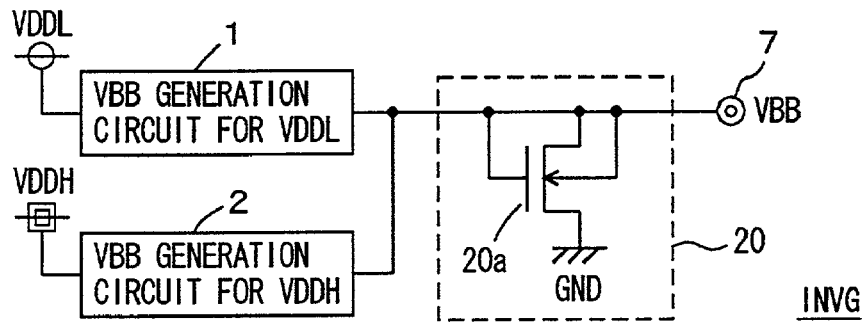
FIG. 15 is a schematic diagram showing the construction of a negative voltage generation circuit in a seventh embodiment according to the present invention.

FIG. 15 is a schematic diagram showing the construction of a negative voltage generation circuit in the seventh embodiment according to the present invention. In the negative voltage generation circuit shown in FIG. 15, a clamp circuit 20 is provided, to negative voltage output node 7, to prevent the substrate bias voltage VBB from rising up to a predetermined voltage level or more. Clamp circuit 20 is constituted of an N channel MOS transistor 20a having a gate, a drain and a back gate connected to negative voltage output node 7 and having a source connected to the ground node.

MOS transistor 20a has a threshold voltage Vth so as to prevent bias voltage VBB from negative voltage output node 7 from rising to threshold voltage Vth or higher. As in the case of the first embodiment shown in FIG. 1, VBB generation circuit 1 for VDDL and VBB generation circuit 2 for VDDH are provided for negative voltage output node 7.

The gate, drain and back gate of MOS transistor 20a are connected together to the negative voltage output node 7 and MOS transistor 20a functions as a diode. Accordingly, if the voltage level of negative voltage output node 7 becomes equal to or higher than threshold voltage Vth of MOS transistor 20a, MOS transistor 20a is rendered conductive and decreases the voltage level of bias voltage VBB.

On the other hand, if the voltage level of negative voltage output node 7 becomes lower than threshold voltage Vth of MOS transistor 20a, MOS transistor 20a is maintained nonconductive. Therefore, the voltage level of negative voltage output node 7 can be prevented from rising to the threshold voltage Vth level or higher.

Negative voltage output node 7 is coupled to impurity region 1051 shown in FIG. 40. Therefore, if threshold voltage Vth of MOS transistor 20a is equal to or lower than a forward voltage drop Vbe of parasitic bipolar transistor Q2, it is possible to prevent parasitic bipolar transistor Q2 from becoming conductive and to suppress a latch-up phenomenon.

The base to emitter forward voltage drop Vbe of parasitic bipolar transistor Q2 is a diffusion potential between P well 1050 and N type impurity region 1052. The voltage Vbe can be set substantially equal to threshold voltage Vth of MOS transistor 20a. Also, by adjusting the impurity concentrations of the substrate region (back gate) and the source impurity region of MOS transistor 20a, it is possible to make threshold voltage Vth of transistor 20a lower than the base to emitter forward voltage drop Vbe of parasitic bipolar transistor Q2, i.e., a PN junction diffusion potential, to thereby reliably prevent parasitic bipolar transistor Q2 from becoming conductive.

It is noted that a diode is formed by the PN junction between the back gate of and the impurity region MOS transistor 20a. If bias voltage VBB rises to diffusion potential φ or higher, MOS transistor 20a becomes conductive. Normally, diffusion potential φ is lower than threshold voltage Vth. It is, therefore, possible to clamp the level of bias voltage VBB to a lower potential level than threshold voltage Vth and to thereby reliably prevent the base to emitter region of the parasitic bipolar transistor from being forwardly biased. Particularly, the diffusion potential φ is provided by the PN junction between the substrate region and the impurity region and substantially the same as the base to emitter forward voltage drop of the parasitic bipolar transistor. By using the diode-connected MOS transistor as a clamping element, therefore, it is possible to reliably prevent the parasitic bipolar transistor from becoming conductive.

In the construction shown in FIG. 15, the N channel MOS transistor is diode-connected and used as a clamping element. Alternatively, a diode-connected P channel MOS transistor may be used for the clamping element.

As stated so far, according to the seventh embodiment of the present invention, one MOS transistor is used as an element clamping the upper limit voltage of the negative voltage output node. It is, therefore, possible to prevent the bipolar transistor from performing a thyristor operation and to reliably suppress a latch-up phenomenon irrespectively of the power supply voltage application sequence. Further, since only one MOS transistor is used, a circuit layout area can be reduced.

[Eighth Embodiment]

Figure 16:
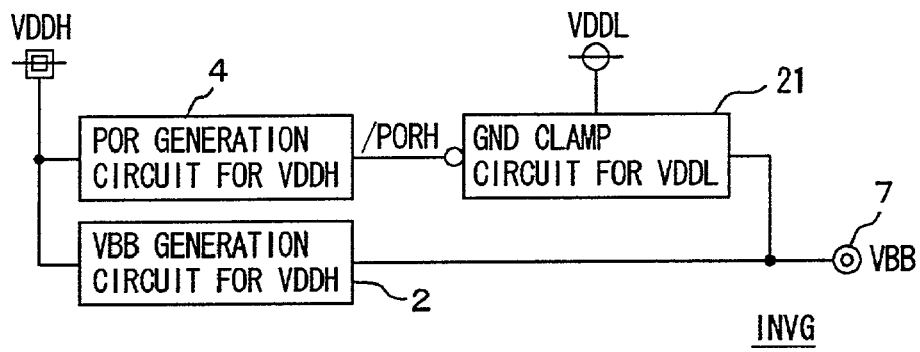
FIG. 16 is a schematic diagram showing the construction of a negative voltage generation circuit in an eighth embodiment according to the present invention.

FIG. 16 is a schematic diagram showing the construction of a negative voltage generation circuit in the eighth embodiment according to the present invention. The negative voltage generation circuit shown in FIG. 8 includes VBB generation circuit 2 for VDDH which generates bias voltage VBB in accordance with memory power supply voltage VDDH, POR generation circuit 4 for VDDH which detects the application of memory power supply voltage VDDH, and a GND clamp circuit 21 for VDDL which clamps the voltage level of negative voltage output node 7 to the ground voltage level if memory power on detection signal /PORH applied from POR generation circuit 4 for VDDH is in an active state (at the L level). GND clamp circuit 21 for VDDL receives logic power supply voltage VDDL as one operating power supply voltage.

Figure 17:
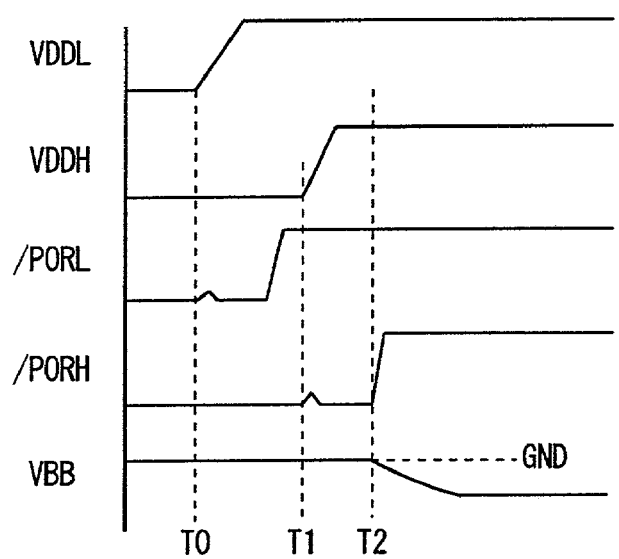
FIG. 17 is a signal waveform diagram representing an operation of the negative voltage generation circuit shown in FIG. 16.

The concrete construction of GND clamp circuit 21 for VDDL is the same as that of GND clamp circuit 10 for VDDL shown in FIG. 9. Now, the operation of the negative voltage generation circuit shown in FIG. 16 will be described with reference to a timing chart shown in FIG. 17. It is noted that the following description will be given to the case where VBB generation circuit 2 for VDDH performs a negative voltage generation circuit in response to the inactivation of memory power on detection signal /PORH. It is also noted, however, that VBB generation circuit 2 for VDDH may generate a negative voltage in accordance with memory power supply voltage VDDH. In the latter case, if memory power supply voltage VDDH is stabilized, VBB generation circuit 2 for VDDH effectively performs a negative voltage generation operation.

At time T0, logic power supply voltage VDDL is applied. At this moment, memory power supply voltage VDDH is not applied yet. In this state, memory power on detection signal /PORH is at the L level, GND clamp circuit 21 for VDDL operates to fix the voltage level of voltage VBB on negative voltage output node 7 to the ground voltage level.

At time T1, memory power supply voltage VDDH is applied. At time T2, memory power on detection signal /PORH rises to the H level. In response to the rise of memory power on detection signal /PORH, the clamp operation of GND clamp circuit 21 for VDDL is stopped. On the other hand, VBB generation circuit 2 for VDDH effectively starts a negative voltage generation operation in accordance with the stable memory power supply voltage and decreases the voltage level of negative voltage output node 7. Therefore, even if logic power supply voltage VDDL is applied before application of memory power supply voltage VDDH, the voltage level of negative voltage output node 7 is fixed to the ground voltage level in a transient period before VBB generation circuit 2 for VDDH effectively generates a negative voltage. As a result, if logic power supply voltage VDDL is applied before application of memory power supply voltage VDDH, it is possible to reliably prevent negative voltage output node 7 from entering a floating state and to prevent a latch-up phenomenon from occurring.

Figure 18:
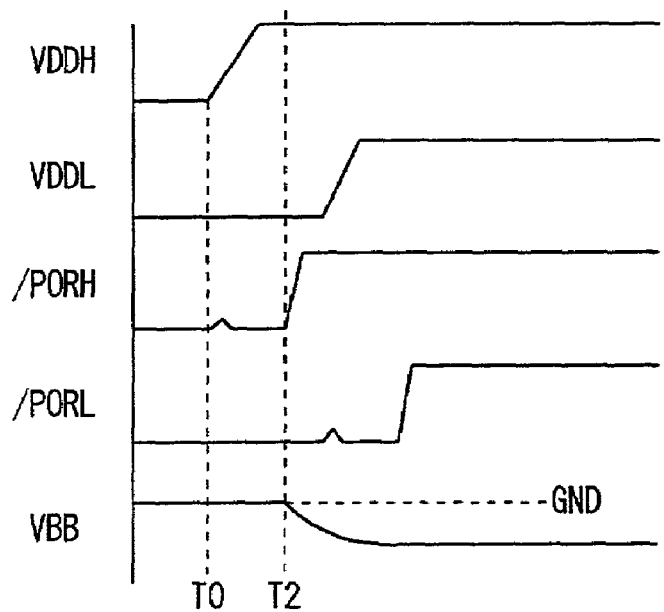
FIG. 18 is a signal waveform diagram representing an operation of the negative voltage generation circuit shown in FIG. 16.

Next, referring to FIG. 18, the operation of the negative voltage generation circuit in the case where memory power supply voltage VDDH is applied before application of logic power supply voltage VDDL will be described. As shown in FIG. 18, at time T0, memory power supply voltage VDDH is applied. At time T2, memory power on detection signal /PORH rises to the H level. The clamp operation of GND clamp circuit 21 for VDDL is enabled in accordance with memory power on detection signal /PORH being L level.

However, since logic power supply voltage VDDL is not applied yet, P channel MOS transistor 10a, shown in FIG. 9, in GND clamp circuit 21 for VDDL is not sufficiently made conductive and the voltage level of internal node 10d, shown in FIG. 9, is clamped to the absolute value |Vthp| level of the threshold voltage of P channel MOS transistor 10a. In this state, the voltage level of internal node 10d is set higher than the voltage level of the logic power source node by absolute value |Vthp| of the threshold voltage of P channel MOS transistor 10a. As a result, N channel MOS transistor 10c for clamping enters substantially an intermediate state between the on state and the off state, thereby making it possible to prevent the voltage level of negative voltage output node 7 from rising up relative to the ground voltage level.

If negative voltage output node 7 is driven to a negative voltage level, the clamp transistor of GND clamp circuit 21 for VDDL is turned off to exert no influence on the negative voltage generation operation of VBB generation circuit 2 for VDDH.

At time T2, when memory power on detection signal /PORH rises to the H level, VBB generation circuit 2 for VDDH operates according to the stable memory power supply voltage, effectively executes a negative voltage generation operation and decrease the voltage level of negative voltage output node 7. Even if logic power supply voltage VDDL is applied next, the clamp operation of GND clamp circuit 21 for VDDL has already been prohibited and logic power supply voltage VDDL exerts, therefore, no influence on the negative voltage generation operation of VBB generation circuit 2 for VDDH.

Therefore, if the voltage level of the logic power source node rises by power source noise while memory power on detection signal /PORH is at the L level, the voltage level of internal node 10d of GND clamp circuit 21 for VDDL rises according to the noise level. Accordingly, clamping MOS transistor 10a becomes conductive and the voltage level of negative voltage output node 7 is maintained to the ground voltage level. Therefore, even if power source noise occurs to the logic power source node, it is possible to reliably fix the voltage level of negative voltage output node 7 to the ground voltage level and to reliably prevent the base to emitter region of parasitic bipolar transistor Q2 shown in FIG. 40 from being forwardly biased.

As stated so far, according to the eighth embodiment of the present invention, the circuit is provided for generating a negative voltage according to the memory power supply voltage, and the logic power supply voltage is applied to the clamp circuit clamping the voltage level of the negative voltage output node to the ground voltage level when the memory power on detection signal is active. It is, therefore, possible to reliably fix the voltage level of the negative voltage output node to the ground voltage level even if the logic power supply voltage is applied before application of the memory power supply voltage, and to reliably suppress a latch-up operation. Besides, it is possible to decrease the number of the components of the negative voltage generation circuit and, accordingly, to reduce a circuit layout area and current consumption.

If the absolute value of the threshold voltage of the level conversion P channel MOS transistor of GND clamp circuit 21 for VDDL may be set sufficiently higher than the threshold voltage of the N channel MOS transistor for clamping the negative voltage output node, even in the case where VBB generation circuit 2 for VDDH performs a negative voltage generation operation in response to the memory power on detection signal, the negative voltage output node can be reliably clamped to the ground voltage level even when the memory power supply voltage is applied before application of logic power supply voltage.

[Ninth Embodiment]

Figure 19:
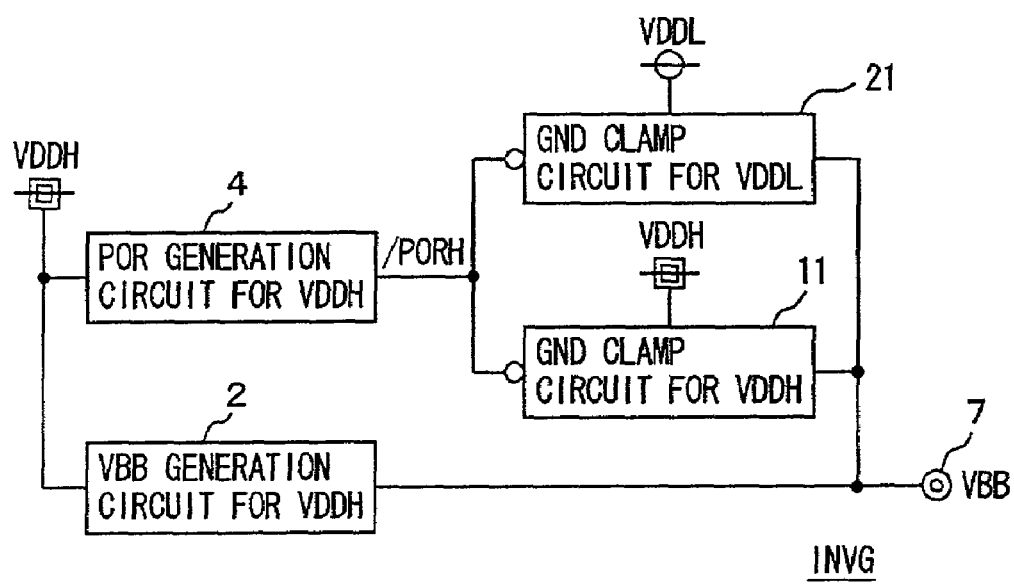
FIG. 19 is a schematic diagram showing the construction of a negative voltage generation circuit in a ninth embodiment according to the present invention.

FIG. 19 is a schematic diagram showing the construction of a negative voltage generation circuit in the ninth embodiment according to the present invention. The construction of negative voltage generation circuit shown in FIG. 19 differs from that of the negative voltage generation circuit shown in FIG. 16 in the following points. In FIG. 19, GND clamp circuit 11 for VDDH fixing the voltage level of negative voltage output node 7 to the ground voltage level when memory power on detection signal /PORH is active, is provided in parallel to GND clamp circuit 21 for VDDL. The remaining construction is the same as that shown in FIG. 16. Therefore, corresponding components are denoted by the same reference numerals as those in FIG. 16 and detailed description thereof will not be given.

GND clamp circuit 11 for VDDH is the same in construction as GND clamp circuit shown in FIG. 9.

In the negative voltage generation circuit shown in FIG. 19, if memory power voltage VDDH is applied before application of logic power voltage VDDL, the voltage level of negative voltage output node 7 can be maintained to the ground voltage level by GND clamp circuit 11 for VDDH while memory power on detection signal /PORH is at the L level. On the other hand, if logic power supply voltage VDDL is applied before application of memory power supply voltage VDDH, GND clamp circuit 21 for VDDL maintains the voltage level of negative voltage output node 7 to the ground voltage level. Therefore, irrespectively of the sequence of applying power supply voltages VDDL and VDDH, it is possible to maintain the voltage level of negative voltage output node 7 to the ground voltage level in the transient period of the power supply voltage applied first. Also, VBB generation circuit 2 for VDDH effectively operates to thereby reliably fix the voltage level of negative voltage output node 7 to the ground voltage level until a negative voltage is generated on negative voltage output node 7 and to reliably suppress a latch-up phenomenon irrespectively of the power up sequence of the power supply voltages.

As stated so far, according to the ninth embodiment of the present invention, both the GND clamp circuit for VDDL and the GND clamp circuit for VDDH are constructed to operate while the memory power on detection signal is active. Therefore, in the transient period before a negative voltage is effectively generated in accordance with the memory power supply voltage, it is possible to reliably maintain the voltage level of the negative voltage output node to the ground voltage level and to reliably suppress a latch-up phenomenon irrespectively of the power up sequence of the power supply voltages.

[Tenth Embodiment]

Figure 20:
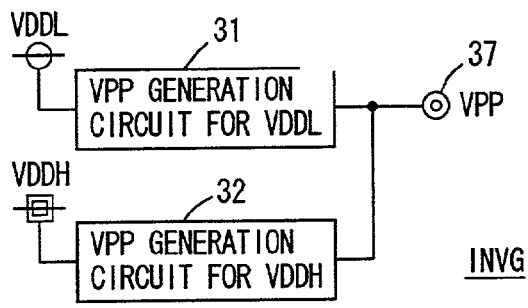
FIG. 20 is a schematic diagram showing the construction of a boosted voltage generation circuit in a tenth embodiment according to the present invention.

FIG. 20 is a schematic diagram showing the construction of an internal voltage generation circuit in the tenth embodiment according to the present invention. FIG. 20 schematically shows the construction of a boosted voltage generation circuit generating boosted voltage VPP and included in internal voltage generation circuit INVG.

In FIG. 20, this boosted voltage generation circuit includes a VPP generation circuit 31 for VDDL which generates boosted voltage VPP toward a high voltage output node 37 in accordance with logic power supply voltage VDDL, and a VPP generation circuit 32 for VDDH which generates boosted voltage VPP onto high voltage output node 37 in accordance with memory power supply voltage VDDH. VPP generation circuits 31 and 32 each perform charge pumping operation using a capacitor and generate boosted voltage VPP from corresponding power supply voltages VDDL and VDDH.

In the construction of the boosted voltage generation circuit shown in FIG. 20, if logic power supply voltage VDDL is applied before application of memory power supply voltage VDDL, VPP generation circuit 31 for VDDL can generate boosted voltage VPP in accordance with logic power supply voltage VDDL. With the construction shown in FIG. 40, therefore, the voltage level of impurity region 1041 (well potential fixing node n1) can be set higher than the voltage level of impurity region 1042, whereby parasitic diode D1 can be maintained nonconductive and the base to emitter region of parasitic bipolar transistor Q1 can be prevented from being forwardly biased. As a result, the parasitic thyristor constituted of parasitic bipolar transistors Q1 and Q2 is not turned on. Hence, even if logic power supply voltage VDDL is applied before application of memory power supply voltage VDDH, it is possible to suppress a latch-up phenomenon.

If memory power supply voltage VDDH is applied first, logic power supply voltage VDDL is at the ground voltage or L level. As in the case of the above, it is possible to maintain the base to emitter region of bipolar transistor Q1 in an reverse bias state. It is also possible to prevent the parasitic thyristor from being turned on and to suppress a latch-up phenomenon.

It is noted that the circuits 31 and 32 each generating boosted voltage VPP also perform charge pumping operations in accordance with the application of the corresponding power supply voltages and generate boosted voltages unless specified otherwise in the following.

As stated so far, according to the tenth embodiment of the present invention, the circuits each generating boosted voltage VPP in accordance with logic power supply voltage and memory power supply voltage, respectively, are provided, thereby making it possible to reliably suppress a latch-up phenomenon irrespectively of the power up sequence of the power supply voltages.

[Eleventh Embodiment]

Figure 21:
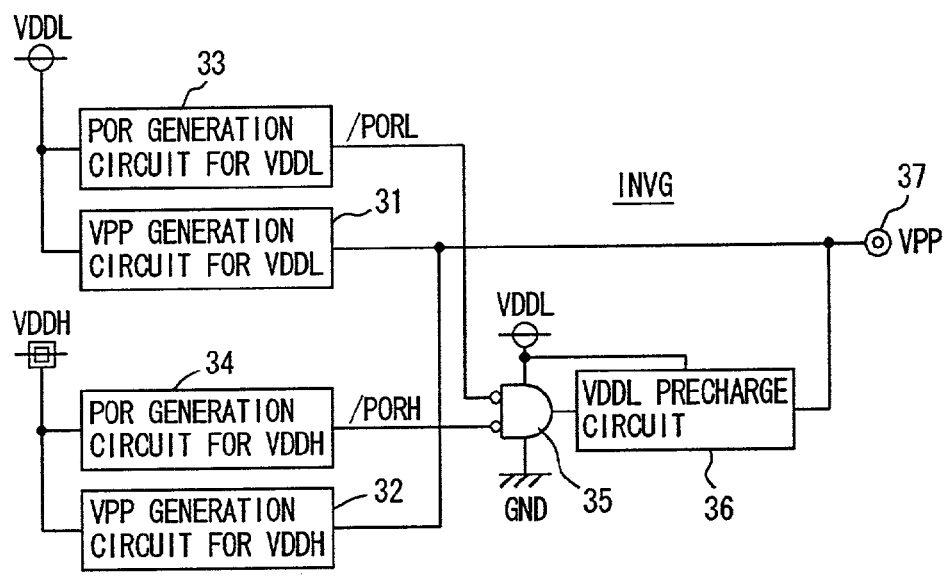
FIG. 21 is a schematic diagram showing the construction of a boosted voltage generation circuit in an eleventh embodiment according to the present invention.

FIG. 21 is a schematic diagram showing the construction of a boosted voltage generation circuit included in internal voltage generation circuit INVG (simply referred to as "boosted voltage generation circuit" hereinafter) in the eleventh embodiment according to the present invention. In FIG. 21, the boosted voltage generation circuit includes, in addition to VPP generation circuit 31 for VDDL and VPP generation circuit 32 for VDDH shown in FIG. 20, a POR generation circuit 33 for VDDL which detects the application of logic power supply voltage VDDL and generates logic power on detection signal /PORL, a POR generation circuit 34 for VDDH which detects the application of memory power supply voltage VDDH and generates memory power on detection signal /PORH in accordance with the detection result, an NOR circuit 35 receiving power on detection signals /PORL and /PORH, and a VDDL precharge circuit 36 selectively precharging a boosted voltage output node 37 to the logic power supply voltage VDDL level in accordance with the output signal of NOR circuit 35.

NOR circuit 35 and VDDL precharge circuit 36 receive logic power supply voltage VDDH as an operating power supply voltage. VDDL precharge circuit 36 performs a precharging operation if the output signal of NOR circuit 35 is at the H level, i.e., if both power on detection signals /PORL and /PORH are at the L level. Now, the operation of the boosted voltage generation circuit shown in FIG. 21 will be described with reference to timing charts shown in FIGS. 22 and 23.

Figure 22:
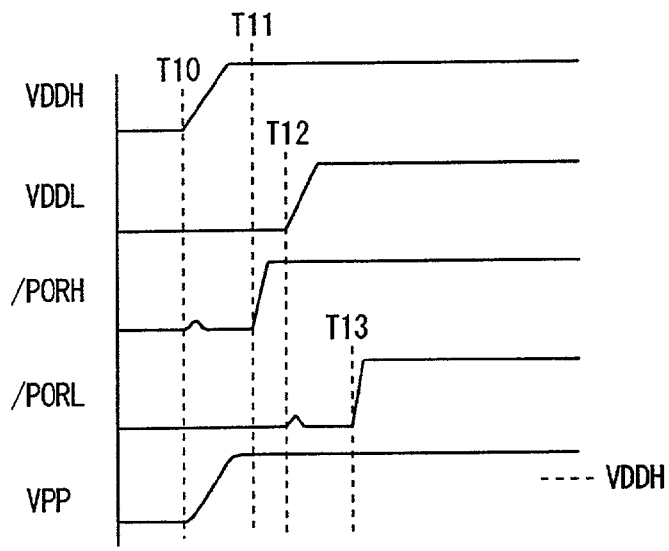
FIG. 22 is a signal waveform diagram representing an operation of the boosted voltage generation circuit shown in FIG. 21.

Referring first to FIG. 22, description will be given to the operation of the boosted voltage generation circuit in the case where memory power supply voltage VDDH is applied before application of logic power supply voltage VDDL.

At time T10, memory power supply voltage VDDH is applied and the voltage level thereof rises. Since logic power supply voltage VDDL is not applied, logic power on detection signal /PORL is at the L level. In this state, L-level signals are applied to the inputs of NOR circuit 35. Logic power supply voltage VDDL is at the L level, the output signal of NOR circuit 35 is at the L level and VDDL precharge circuit 36 does not perform a precharge operation.

In this state, at time T11, memory power on detection signal /PORH rises to the H level, VPP generation circuit 32 for VDDH effectively performs a boosted voltage generation operation in accordance with stable memory power supply voltage VDDH and the voltage level of boosted voltage VPP is maintained higher than that of memory power supply voltage VDDH.

At time T12, logic power supply voltage VDDL is applied. At time T13, the level of logic power on detection signal /PORL rises to the H level. In this state, even if logic power supply voltage VDDL is applied at time T12, memory power on detection signal /PORH is at the H level, the output signal of NOR circuit 35 is at the L level and VDDL precharge circuit 36 is prohibited from performing a precharge operation. Therefore, it is possible to reliably boost the boosted voltage VPP generated on high voltage output node 37 by VPP generation circuit 32 for VDDH. Also, if logic power supply voltage VDDL is applied, VPP generation circuit 31 for VDDL performs a boosting operation. If logic power supply voltage VDDL is stabilized, logic power on detection signal /PORL attains the H level.

In this state, therefore, VPP generation circuits 31 and 32 both generate boosted voltage VPP.

Here, as in the case of the negative voltage generation circuit, VPP generation circuits 31 and 32 are constituted to perform boosting operations in accordance with the application of power supply voltages VDDL and VDDH, respectively. While power supply voltages VDDL and VDDH are unstable, the boosted voltage generation operations become unstable. In this transient periods of the power supply voltages, the voltage level of high voltage output node 37 is maintained to a predetermined voltage level until a boosted voltage is effectively generated. Thus, it is possible to prevent the base to emitter region of parasitic bipolar transistor Q1, shown in FIG. 40, from being forwardly biased and to prevent the parasitic thyristor from becoming conductive.

By performing a boosted voltage generation operation in accordance with the application of a power supply voltage, a boosted voltage is generated in accordance with the stable power supply voltage and the voltage level of boosted voltage VPP is prevented from being abruptly changed. As a result, it is possible to prevent an adverse effect of coupling noise or the like and possible to stably drive the voltage level of boosted voltage VPP to a predetermined voltage level.

Figure 23:
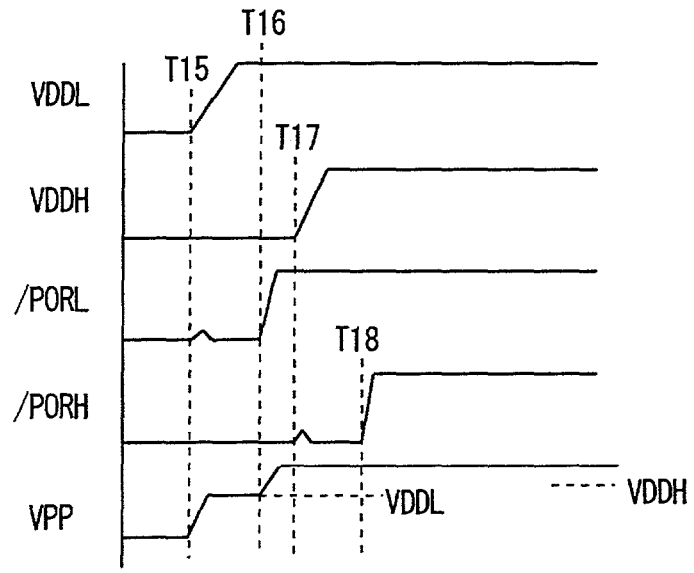
FIG. 23 is a signal waveform diagram representing an operation of the boosted voltage generation circuit shown in FIG. 21.

Now, description will be given to the operation of the boosted voltage generation circuit in the case where logic power supply voltage VDDL is applied before application of memory power supply voltage VDDH, referring to FIG. 23.

At time T15, logic power supply voltage VDDL is applied and the voltage level thereof rises. Since logic power on detection signal /PORL is at the L level. Memory power supply voltage VDDH is not applied yet, and memory power on detection signal /PORH is at the L level, as well. Therefore, the voltage level of the output signal of NOR circuit 35 rises in accordance with the rise of the voltage level of logic power supply voltage VDDL, and VDDL precharge circuit 36 performs a precharge operation to thereby precharge the boosted voltage VPP of high voltage output node 37 to the logic power supply voltage VDDL level.

At time T16, logic power on detection signal /PORL rises to the H level and VPP generation circuit 31 for VDDL effectively performs a boosted voltage generation operation and raises boosted voltage VPP of high voltage output node 37 to a predetermined voltage level. At this time, the output signal of NOR circuit 35 attains the L level in response to the rise of logic power on detection signal /PORL and the precharge operation of VDDL precharge circuit 36 is stopped. It is, therefore, possible to reliably drive the voltage level of voltage VPP of the high voltage output node to the predetermined boosted voltage level.

At time T17, memory power supply voltage VDDH is applied. At time T18, memory power on detection signal /PORH rises to the H level. As a result, boosted voltage VPP is stably generated by two VPP generation circuits 31 and 32.

In a period between time T15 and T16, the voltage level of high voltage output node 37 is maintained to the logic power supply voltage VDDL level. Therefore, well potential fixing node n1 is at the logic power supply voltage VDDL level and there is no voltage difference between the anode and the cathode of diode element D1, making it possible to maintain parasitic diode D1 non-conductive. Also, in N well 1040, the voltage level of base electrode node n2 of parasitic bipolar transistor Q1 is substantially equal to the logic power supply voltage VDDL level, making it possible to prevent the base to emitter region of parasitic bipolar transistor Q1 from being forwardly biased. This is because the voltage level of N well 1040 is precharged to the logic power supply voltage VDDL level by VDDL precharge circuit 36. Accordingly even if logic power supply voltage VDDL is applied before application of memory power supply voltage VDDH, it is possible to reliably prevent parasitic bipolar transistor Q1 from being turned on and to reliably suppress a latch-up phenomenon.

It is noted that VPP generation circuits 31 and 32 perform boosted voltage generation operations in accordance with corresponding power supply voltages, respectively, independently of their corresponding power on detection signals unless specified otherwise in the following description. Accordingly, if the voltage level of the corresponding power supply voltage does not rise to a predetermined voltage level (threshold voltage level), the VPP generation circuit does not perform a charge pumping operation. In addition, if the VPP generation circuit then performs a charge pumping operation but the voltage level of the corresponding power supply voltage is insufficient, an insufficient charge supply operation is carried out and an unstable boosting operation is carried out. In the following description, the operation of effectively generating a boosted voltage indicates a state in which a charge pumping operation is stably carried out and a boosted voltage is effectively generated.

Figure 24:
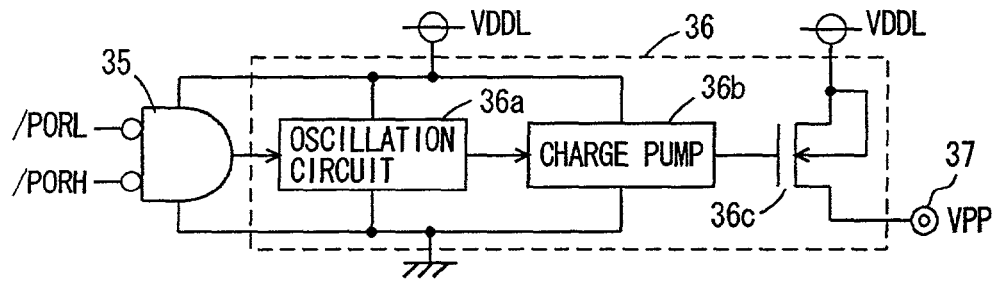
FIG. 24 shows one example of the construction of a VDDL precharge circuit shown in FIG. 21.

FIG. 24 shows an example of the construction of VDDL precharge circuit 36 shown in FIG. 21. In FIG. 24, VDDL precharge circuit 36 includes an oscillation circuit 36a which is enabled to perform an oscillation operation at a predetermined cycle if the output signal of NOR circuit 35 is at the H level, a charge pump 36b generating a voltage higher than logic power supply voltage VDDL, and an N channel MOS transistor 36c selectively made conductive in accordance with the output voltage of charge pump 36b and transmitting logic power supply voltage VDDL of the logic power source node to high voltage output node 37 when being conductive.

Oscillation circuit 36a and charge pump 36b receive logic power supply voltage VDDL as an operating power supply voltage. Charge pump 36b is generally constituted of a charge pumping circuit using a capacitor and drives the gate capacitance of MOS transistor 36c to a higher voltage level than that of logic power supply voltage VDDL. Charge pump 36b is only required to charge the gate capacitance of MOS transistor 36b, so that the charge supply capability of charge pump 36b can be set sufficiently low and the current consumption thereof can be made sufficiently low. Charge pump 36b drives the gate voltage of MOS transistor 36c to a voltage level of (VDDL+Vthn). Here, Vthn is the threshold voltage of MOS transistor 36c. It is thereby possible to transmit logic power supply voltage VDDL to high voltage output node 37.

When charge pump 36b is inactive, the voltage level of the output voltage of charge pump 36b is maintained to the ground voltage level or the logic power supply voltage VDDL level. Accordingly, if boosted voltage VPP is generated on high voltage output node 37 and the voltage level of node 37 rises, MOS transistor 36c is maintained non-conductive to prevent a current from flowing from high voltage output node 37 to the logic power source node.

It is noted that a P channel MOS transistor coupling the gate of MOS transistor 36c to logic power source node when the output signal of NOR circuit 36 attains the L level, may be provide in the construction shown in FIG. 24. By providing such N channel MOS transistor, if the voltage level of boosted voltage VPP is driven beyond logic power supply voltage VDDL, MOS transistor 36c can be turned off and the voltage between the gate and drain of MOS transistor 36c ca be made low, making it possible to sufficiently secure dielectric break down voltage of MOS transistor 36c. Alternatively, an inverter receiving the output signal of NOR circuit 35 and an N channel MOS transistor fixing the gate of MOS transistor 36c to the ground voltage level in accordance with the output signal of this inverter may be provided in place of the P channel MOS transistor. This inverter receives logic power supply voltage VDDL as an operating power supply voltage.

[Modification]

Figure 25:
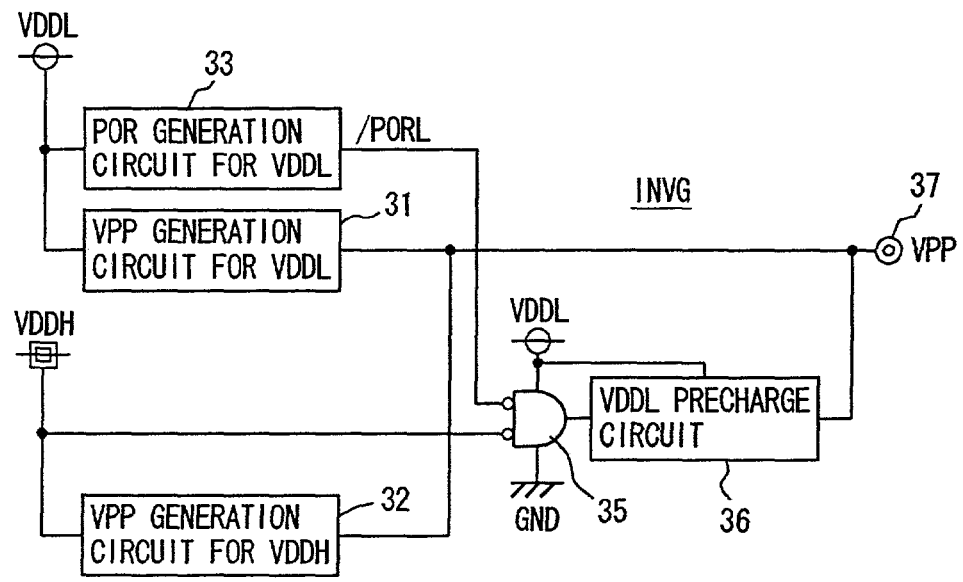
FIG. 25 is a schematic diagram showing the construction of a modification of the eleventh embodiment according to the present invention.

FIG. 25 is a schematic diagram showing the construction of the modification of the eleventh embodiment according to the present invention. In the construction of a boosted voltage generation circuit shown in FIG. 25, memory power supply voltage VDDH, instead of memory power on detection signal /PORH, is applied to NOR circuit 35. The remaining construction of FIG. 25 is the same as that shown in FIG. 21. Therefore, corresponding components are denoted by the same reference numerals as those in FIG. 21 and detailed description will not be given thereto.

In the construction shown in FIG. 25, as in the construction shown in FIG. 21, if logic power supply voltage VDDL is applied before application of memory power supply voltage VDDH, NOR circuit 35 and VDDL precharge circuit 36 can precharge high voltage output node 37 to the logic power supply voltage VDDL level. On the other hand, if memory power supply voltage VDDH is applied before application of logic power supply voltage VDDL, VDDL precharge circuit 36 is in an inoperative state. MOS transistor 36c provided in the output stage of circuit 36 has the source and gate receiving the logic power supply voltage VDDL at the ground voltage level and does not perform the precharging of the high voltage ouput node 37. Thus, MOS transistor 36c is prevented from exerting an adverse effect on the generation of the boosted voltage on the output node 37 by the VPP generation circuit 32 for VDDH. Then, VPP generation circuit 32 for VDDH effectively performs a boosted voltage generation operation in accordance with memory power supply voltage VDDH to raise the voltage level of high voltage output node 37.

As stated so far, according to the eleventh embodiment of the present invention, if the logic power supply voltage is applied first, the high voltage output node is precharged to the logic power supply voltage level until a boosted voltage is stably generated. Thus, even if logic power supply voltage is applied first, it is possible to reliably keep the parasitic bipolar transistor non-conductive and to reliably suppress a latch-up phenomenon.

[Twelfth Embodiment]

Figure 26:
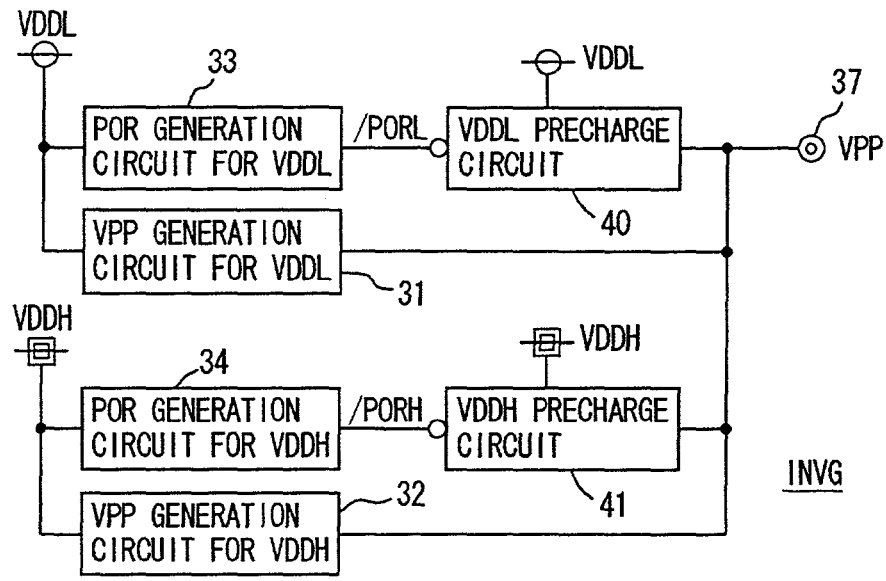
FIG. 26 is a schematic diagram showing the construction of a boosted voltage generation circuit in a twelfth embodiment according to the present invention.

FIG. 26 is a schematic diagram showing the construction of a boosted voltage generation circuit in the twelfth embodiment according to the present invention. The boosted voltage generation circuit shown in FIG. 26 differs from the boosted voltage generation circuit shown in FIG. 21 in the following points. In FIG. 26, the boosted voltage generation circuit includes a VDDL precharge circuit 40 precharging the high voltage output node 37 to the logic power supply voltage VDDL level if logic power on detection signal /PORL from POR generation circuit for VDDL is at the L level, and a VDDH precharge circuit 41 precharging the high voltage output node 37 to the memory power supply voltage VDDH level if memory power on detection signal /PORH from POR generation circuit 34 for VDDH is at the L level. In this embodiment, precharge circuits 40 and 41 are employed in place of NOR circuit 35 and VDDL precharge circuit 36 shown in FIG. 21.

In the construction of the boosted voltage generation circuit shown in FIG. 26, if logic power supply voltage VDDL is applied first, VDDL precharge circuit 40 precharges the high voltage output node 37 to the logic power supply voltage VDDL level. After logic power supply voltage VDDL is applied, the high voltage output node 37 is maintained to the logic power supply voltage VDDL level until VPP generation circuit 31 for VDDL effectively performs a boosting operation.

On the other hand, if memory power supply voltage VDDH is applied first, VDDH precharge circuit 41 precharges the high voltage output node 37 to the memory power supply voltage VDDH level while memory power on detection signal /PORH is at the L level, which can prevent high voltage output node 37 from entering a floating state until VPP generation circuit 32 for VDDH effectively generates a boosted voltage.

Accordingly, irrespectively of the sequence of applying logic power supply voltage VDDL and memory power supply voltage VDDH, it is possible to prevent high voltage output node 37 from entering a floating state, to prevent the base to emitter region of parasitic bipolar transistor Q1, shown in FIG. 40, from being forwardly biased accordingly, and to reliably suppress a latch-up phenomenon.

Figure 27:
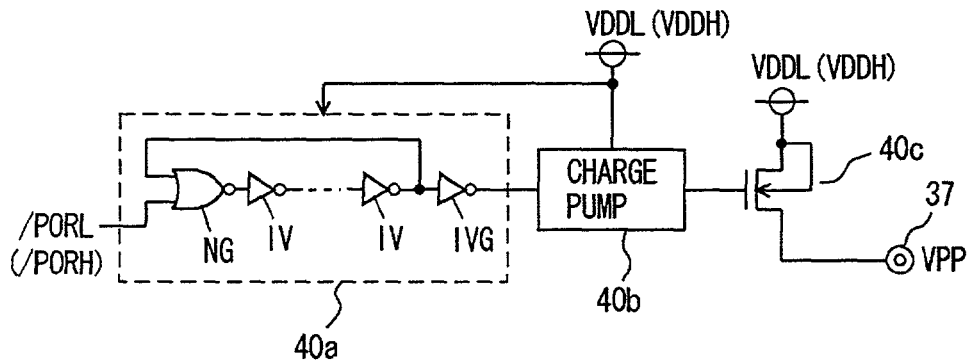
FIG. 27 shows an example of the construction of a precharge circuit shown in FIG. 26.

FIG. 27 shows an example of the construction of VDDL precharge circuit 40 and VDDH precharge circuit 41 shown in FIG. 26. Since precharge circuits 40 and 41 have the same construction and only differ in power on detection signal and power supply voltage applied thereto, the construction of VDDL precharge circuit 40 is shown in FIG. 27. As for the construction of VDDH precharge circuit 41, a power supply voltage and a power on detection signal for VDDH precharge circuit 41 are shown in parentheses in FIG. 27.

In FIG. 27, VDDL precharge circuit 40 includes an oscillation circuit 40a performing an oscillation operation if logic power on detection signal /PORL is at the L level, a charge pump 40b performing a charge pumping operation through a capacitor in accordance with the oscillation signal of oscillation circuit 40a and generating a higher voltage than logic power supply voltage VDDL, and an N channel MOS transistor 40c selectively rendered conductive in accordance with the output signal of charge pump 40b and transmitting logic power supply voltage VDDL of the logic power source node to high voltage output node 37.

Oscillation circuit 40a includes even number of cascaded stages of inverters IV's, an NOR circuit NG receiving the output signal of the inverter in the last stage of cascaded inverters IV's and logic power on detection signal /PORL, and an inverter IVG inverting the output signal of the inverter in the last stage of cascaded inverters IV's and applying the inverted output signal to charge pump 40b.

Oscillation circuit 40a and charge pump circuit 40b receive logic power supply voltage VDDL as an operating power supply voltage.

When logic power on detection signal /PORL is at the L level, NOR circuit NG operates as an inverter. Accordingly, a ring oscillator is formed by NOR circuit NG and inverters IV's in accordance with the rise of the voltage level of logic power supply voltage VDDL. The ring oscillator performs an oscillation operation in a predetermined cycle and an oscillation signal subjected to waveform shaping is applied through inverters IVG to charge pump 40b.

Charge pump 40b performs a charge pumping operation in accordance with the oscillation signal from oscillation circuit 40a, generates a higher voltage than logic power supply voltage VDDL and applies the generated voltage to the gate of MOS transistor 40c. MOS transistor 40c is rendered conductive in accordance with the charge-pumped voltage from charge pump 40b and transmit logic power supply voltage VDDL to high voltage output node 37.

When logic power on detection signal /PORL is at the H level, the output signal of NOR circuit NG is fixed to the L level, the oscillation operation of oscillation circuit 40a is stopped and the charge pumping operation of charge pump 40b is responsively stopped. At this time, VPP generation circuit 31 for VDDL effectively performs a boosting operation to raise the boosted voltage VPP applied from high voltage output node 7 to a level higher than that of logic power supply voltage VDDL. Therefore, even if the output voltage of charge pump 40b is at the L level, or at the logic power supply voltage VDDL level, MOS transistor 40c is turned off and exerts no adverse influence on the voltage level of boosted voltage VPP.

It is noted that in the construction of VDDL precharge circuit 40 shown in FIG. 27, an N channel MOS transistor connecting the gate of MOS transistor 40c to the ground node in response to the inverted signal of logic power on detection signal /PORL may be further provided. Alternatively, a P channel MOS transistor connecting the gate of MOS transistor 40c to the logic power source node in response to the inverted signal of logic power on detection signal /PORL may be further provided.

As stated so far, according to the twelfth embodiment of the present invention, the high voltage output node is precharged to the logic power supply voltage level or the memory power supply voltage level in accordance with the logic power on detection signal or the memory power on detection signal. It is, therefore, possible to precharge the high voltage output node 37 to the power supply voltage applied first. Thus, the high voltage output node can be reliably fixed to a predetermined voltage level even if the voltage level of boosted voltage VPP is unstable during the transient period in the application of the power supply voltage. As a result, it is possible to reliably maintain parasitic bipolar transistor nonconductive to reliably suppress a latch-up phenomenon irrespectively of the power up sequence of the power supply voltages.

[Thirteenth Embodiment]

Figure 28:
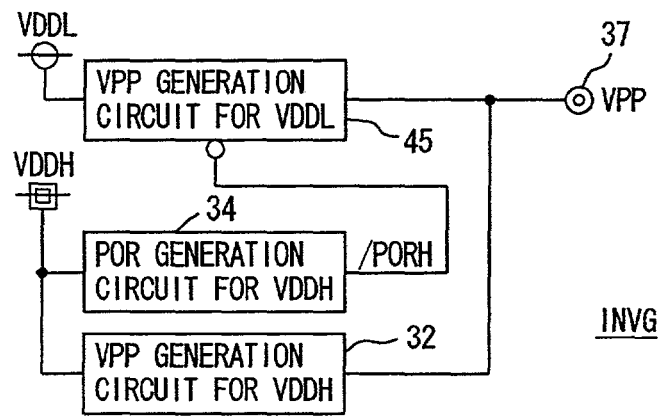
FIG. 28 is a schematic diagram showing the construction of a boosted voltage generation circuit in a thirteenth embodiment according to the present invention.

FIG. 28 is a schematic diagram showing the construction of a boosted voltage generation circuit in the thirteenth embodiment according to the present invention. In FIG. 28, the boosted voltage generation circuit includes VPP generation circuit 32 for VDDH which generates boosted voltage VPP from memory power supply voltage VDDH, POR generation circuit 34 for VDDH which detects the application of memory power supply voltage VDDH, and VPP generation circuit 45 for VDDL which is enabled to generate boosted voltage VPP in accordance with logic power supply voltage VDDL when memory power on detection signal /PORH is at the L level. VPP generation circuit 32 generates boosted voltage VPP onto high voltage output node 37 in accordance with memory power supply voltage VDDH independently of memory power on detection signal /PORH.

In the construction of the boosted voltage generation circuit shown in FIG. 28, if logic power supply voltage VDDL is applied before application of memory power supply voltage VDDH, VPP generation circuit 45 for VDDL operates to generate booted voltage VPP onto high voltage output node 37 in accordance with logic power supply voltage VDDL since memory power on detection signal /PORH is at the L level. When memory power supply voltage VDDH is applied next, VPP generation circuit 32 for VDDH performs a boosting operation in accordance with memory power supply voltage VDDH. When a predetermined period passes since memory power supply voltage VDDH is applied and memory power supply voltage VDDH is stabilized, then memory power on detection signal /PORH from POR generation circuit 34 for VDDH attains the H level and the boosted voltage generation operation of VPP generation circuit 45 for VDDL is stopped. In this state, therefore, boosted voltage VPP is generated by VPP generation circuit 32 for VDDH.

On the other hand, if memory power supply voltage VDDH is applied before application of logic power supply voltage VDDL, VPP generation circuit 32 for VDDH generates boosted voltage VPP in accordance with memory power supply voltage VDDH. When memory power supply voltage VDDH is stabilized, then memory power on detection signal /PORH attains the H level and VPP generation circuit 45 for. VDDL is set in a disabled state. Accordingly, even if logic power supply voltage VDDL is applied thereafter, the boosting operation of VPP generation circuit 45 for VDDL is stopped and boosted voltage VPP is generated by VPP generation circuit 32 for VDDH.

In the construction of the boosted voltage generation circuit shown in FIG. 28, as in the case of the preceding embodiments, if logic power supply voltage VDDL is applied before application of memory power supply voltage VDDH, VPP generation circuit 45 for VDDL generates boosted voltage VPP until memory power supply voltage VDDH is stabilized. It is, therefore, possible to prevent high voltage output node 37 from entering a floating state and to reliably prevent a latch-up phenomenon from occurring.

Further, when memory power supply voltage VDDH is stabilized, boosted voltage VPP is generated only by VPP generation circuit 32 for VDDH. It is, therefore, possible to reduce the current consumption of VPP generation circuit 45 for VDDL and to reduce standby current accordingly. Furthermore, since boosted voltage VPP is generated only by VPP generation circuit 32 for VDDH, it is possible to prevent boosted voltage VPP from becoming unnecessarily high, to suppress generation of unnecessarily high boosted voltage and to reduce current consumption accordingly.

It is noted that in the construction of the boosted voltage generation circuit shown in FIG. 28, VPP generation circuits 32 and 45 perform a boosting operation and generate boosted voltage VPP in accordance with power supply voltages VDDH and VDDL, respectively. Alternatively, the boosted voltage generation circuit may be constituted to enable the boosted voltage generation operation of VPP generation circuit 32 for VDDH when memory power on detection signal /PORH attains the H level.

As stated so far, according to the thirteenth embodiment of the present invention, the circuit generating a boosted voltage in accordance with the logic power supply voltage is enabled only while the memory power on detection signal is at the L level. Thus, it is possible to reduce a circuit layout area, to reduce current consumption and to reliably suppress a latch-up phenomenon.

[Fourteenth Embodiment]

Figure 29:
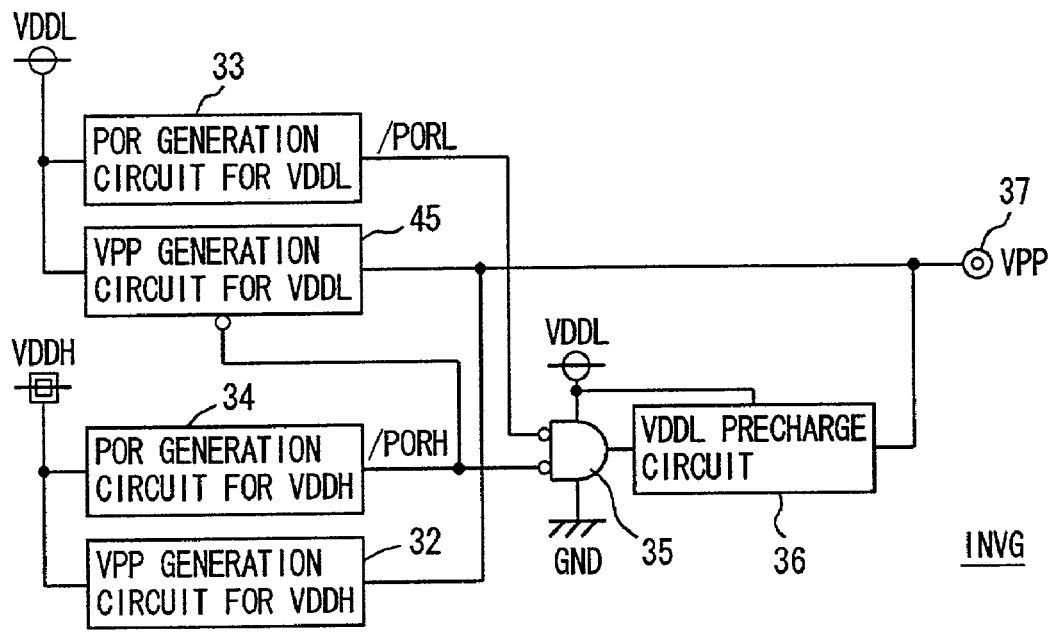
FIG. 29 is a schematic diagram showing the construction of a boosted voltage generation circuit in a fourteenth embodiment according to the present invention.

FIG. 29 is a schematic diagram showing the construction of a boosted voltage generation circuit in the fourteenth embodiment according to the present invention. The construction of the boosted voltage generation circuit shown in FIG. 29 differs from that of the boosted voltage generation circuit shown in FIG. 21 in the following point. In FIG. 29, VPP generation circuit 45 for VDDL that is enabled, only when memory power on detection signal /PORH is at the L level, to generate boosted voltage VPP in accordance with logic power supply voltage VDDL, is employed in place of VPP generation circuit 31 for VDDL that generates boosted voltage VPP in accordance with logic power supply voltage VDDL. The remaining construction of the boosted voltage generation circuit shown in FIG. 29 is the same as that of the boosted voltage generation circuit shown in FIG. 21. Therefore, corresponding components are denoted by the same reference numerals as those in FIG. 21 and detailed description will not be given thereto.

In the construction of the boosted voltage generation circuit shown in FIG. 29, VPP generation circuit 45 for VDDL generates boosted voltage VPP only if logic power supply voltage VDDL is applied first. If memory power supply voltage VDDH is applied and memory power on detection signal /PORH attains the H level, the boosted voltage generation operation by VPP generation circuit 45 for VDDL is stopped. In the case of the boosted voltage generation circuit shown in FIG. 29, therefore, it is possible to further reduce current consumption, compared with the boosted voltage generation circuit shown in FIG. 21.

Furthermore, the boosted voltage generation circuit shown in FIG. 29 can provide the same effect as that of the boosted voltage generation circuit shown in FIG. 21.

[Fifteenth Embodiment]

Figure 30:
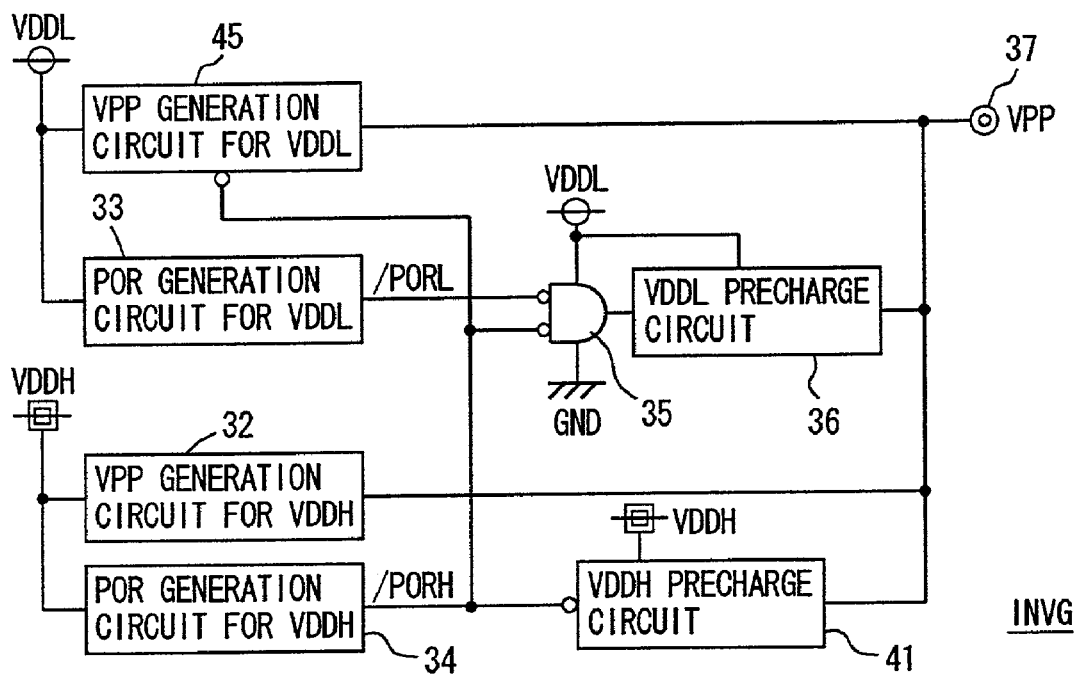
FIG. 30 a schematic diagram showing the construction of a boosted voltage generation circuit in a fifteenth embodiment according to the present invention.

FIG. 30 is a schematic diagram showing the construction of a boosted voltage generation circuit in the fifteenth embodiment according to the present invention. The construction of the boosted voltage generation circuit shown in FIG. 30 differs from that of the boosted voltage generation circuit shown in FIG. 29 in the following point. In FIG. 30, the boosted voltage generation circuit further includes VDDH precharge circuit 41 precharging the high voltage output node 37 to the memory power supply voltage VDDH level when memory power on detection signal /PORH from POR generation circuit 34 for VDDH is at the L level. The remaining construction of the boosted voltage generation circuit shown in FIG. 30 is the same as that of the boosted voltage generation circuit shown in FIG. 29. Therefore, corresponding components are denoted by the same reference numerals as those in FIG. 29 and detailed description will not be given thereto.

If logic power supply voltage VDDL is applied before application of memory power supply voltage VDDH, VPP generation circuit 45 for VDDL performs a boosting operation and generates boosted voltage VPP onto high voltage output node 37 in accordance wit logic power supply voltage VDDL. In this case, VDDL precharge circuit 36 precharges the high voltage output node 37 to the logic power supply voltage VDDL level while both logic power on detection signal /PORL and memory power on detection signal /PORH are at the L level. When logic power on detection signal /PORL attains the H level, the precharge operation of VDDL precharge circuit 36 is stopped. On the other hand, if memory power on detection signal /PORH is still at the L level, VPP generation circuit 45 for VDDL performs a boosting operation to raise the voltage level of high voltage output node 37.

When memory power supply voltage VDDH is applied, VPP generation circuit 32 for VDDH performs a boosting operation in accordance with memory power supply voltage VDDH. Since memory power on detection signal /PORH is at the L level, VDDH precharge circuit 41 performs a precharge operation to precharge the high voltage output node 37 to the memory power source VDDH level.

In this case, VPP generation circuit 45 for VDDL performs a boosting operation. If boosted voltage VPP generated by VPP generation circuit 45 for VDDL is higher in level than memory power supply voltage VDDH, a current flows from VPP generation circuit 45 for VDDL to the memory power source node through VDDH precharge circuit 41. However, if the charge supply capability of VPP generation circuit 45 for VDDL is small and the voltage level of high voltage output node 37 is slightly higher than that of logic power supply voltage VDDL and lower than that of memory power supply voltage VDDH upon application of power supply voltage VDDH, VDDH precharge circuit 41 reliably precharges the high voltage output node 37 to the memory power supply voltage VDDH level without being influenced by the output voltage of VPP generation circuit 45 for VDDL. It is, therefore, possible to prevent unnecessary through-current from being generated.

VPP generation circuit 32 for VDDH is executing the boosting operation in accordance with memory power supply voltage VDDH. However, in the transient period of memory power supply voltage VDDH, the boosting operation of circuit 32 is unstable. Therefore, using VDDH precharge circuit 41, the voltage level of high voltage output node 37 is prevented from becoming unstable.

Then, when memory power on detection signal /PORH attains the H level, the boosting operation of VPP generation circuit 45 for VDDL is stopped and the precharge operation of VDDH precharge circuit 41 is also stopped. However, VPP generation circuit 32 for VDDH performs a boosting operation using stable memory power supply voltage VDDH to raise the voltage level of boosted voltage VPP to a predetermined voltage level at high speed.

In the construction shown in FIG. 30, therefore, if logic power supply voltage VDDL is applied before application of memory power supply voltage VDDH, a current might flow into the memory power source node through VDDH precharge circuit 41 during the precharge operation of VDDH precharge circuit 41 depending on the charge supply capability of VPP generation circuit 45 for VDDL. However, it is possible to reliably set the voltage level of high voltage output node 37 at the logic power supply voltage VDDL level or higher and to reliably suppress a latch-up phenomenon. Further, such a through-current can be sufficiently suppressed by adjusting the charge supply capability of VPP generation circuit 45 for VDDL. Besides, in the sequence of applying logic power supply voltage VDDL and memory power supply voltage VDDH, the time difference between the application of logic power supply voltage VDDL and that of memory power supply voltage VDDH is quite short, so that current consumption can be made sufficiently small.

On the other hand, if memory power supply voltage VDDH is applied before application of logic power supply voltage VDDL, VDDH precharge circuit 41 precharges the high voltage output node 37 to the memory power supply voltage VDDH level while memory power on detection signal /PORH is at the L level. In that period, logic power supply voltage VDDL is not applied. Thus, VDDL precharge circuit 36 does not operate and VPP generation circuit 45 for VDDL does not perform a boosting operation, either.

In this state, VPP generation circuit 32 for VDDH performs a boosting operation in accordance with memory power supply voltage VDDH. However, VDDL precharge circuit 41 is allowed to precharge the high voltage output node 37 to the memory power supply voltage VDDH level, and therefore, the voltage level of high voltage output node 37 is prevented from becoming unstable in the transient period of the application of the power-up. Also, by precharging the high voltage output node 37 to the memory power source VDDH voltage level, the high voltage output node 37 can be driven to a desired high voltage level at high speed when VPP generation circuit 32 for VDDH effectively performs a boosting operation.

when memory power on detection signal /PORH attains the H level, the boosting operation of VPP generation circuit 45 for VDDL is disabled. The output signal of NOR circuit 35 attains the L level and the precharge operation of VDDL precharge circuit 36 is disabled, as well. Accordingly, when memory power on detection signal /PORH attains the H level, VPP generation circuit 32 for VDDH drives the high voltage output node 37 to a predetermined voltage level at high speed using stable memory power supply voltage VDDH.

Consequently, with the construction of the boosted voltage generation circuit shown in FIG. 30, it is possible to reduce standby current, to make it unnecessary to unnecessarily raise boosted voltage VPP and to reduce current consumption.

Furthermore, in the constructions of VDDL precharge circuit 36 and VDDH precharge circuit 41, the level of the gate voltage of precharging MOS transistor (40c) generated by the internal charge pump is set at a higher voltage level (VDDL+Vth or VDDH+Vth) by the threshold voltage of output MOS transistor 40c. Thus, if the voltage level of high voltage output node 37 becomes higher than the logic power supply voltage VDDL or memory power supply voltage VDDH level in each of VDDL precharge circuit 36 and VDDH precharge circuit 41, this precharging MOS transistor in the output stage can be rendered non-conductive to prevent a current from flowing into the corresponding power source node.

[Modification]

Figure 31:
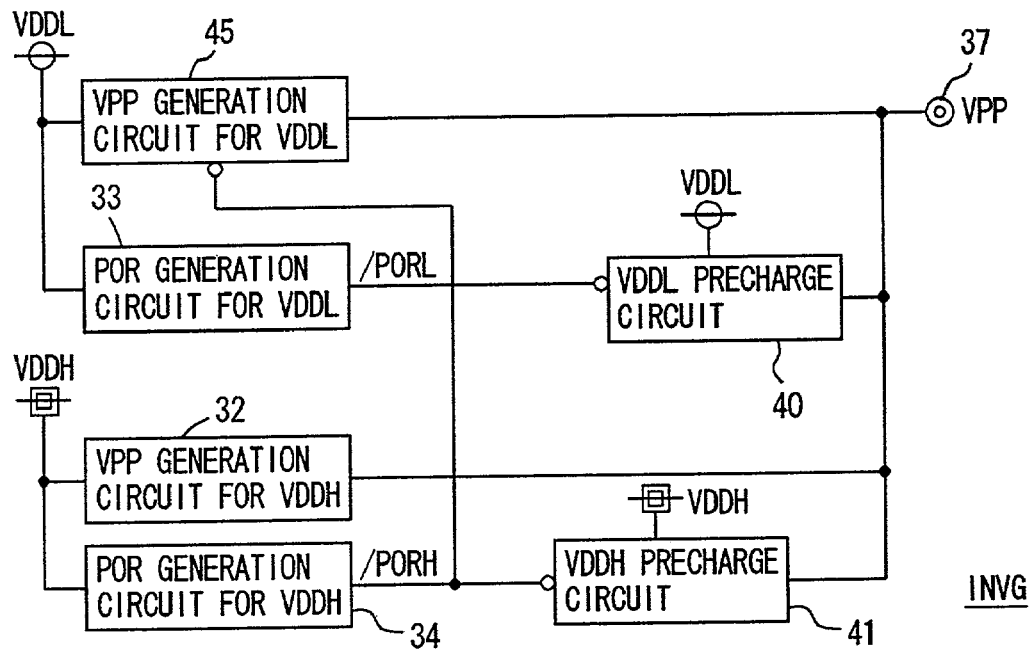
FIG. 31 a schematic diagram showing the construction of a boosted voltage generation circuit in a modification of the fifteenth embodiment according to the present invention.

FIG. 31 is a schematic diagram showing the construction of the modification of the fifteenth embodiment according to the present invention. The construction of the boosted voltage generation circuit shown in FIG. 31 differs from that of the boosted voltage generation circuit shown in FIG. 30 in the following point. In FIG. 31, the boosted voltage generation circuit includes a VDDL precharge circuit 43 activated, when logic power on detection signal /PORL is at the L level, for precharging the high voltage output node 37 to the logic power supply voltage VDDL level, in place of NOR circuit 35 and VDDL precharge circuit 36. The remaining construction of the boosted voltage generation circuit shown in FIG. 31 is the same as that of the boosted voltage generation circuit shown in FIG. 30. Therefore, corresponding components are denoted by the same reference numerals as those in FIG. 30 and detailed description will not be given thereto.

In the construction of the boosted voltage generation circuit shown in FIG. 31, if logic power supply voltage VDDL is applied before application of memory power supply voltage VDDH, VDDL precharge circuit 40 precharges the high voltage output node 37 to the logic power supply voltage VDDL level while logic power on detection signal /PORL is at the L level. In this state, since memory power on detection signal /PORH is at the L level, VPP generation circuit 45 for VDDL performs a boosting operation in accordance with logic power supply voltage VDDL, to generate boosted voltage VPP onto high voltage output node 37. When memory power supply voltage VDDH is applied next, VPP generation circuit 32 for VDDH performs a boosting operation in accordance with memory power supply voltage VDDH.

When memory power supply voltage VDDH is applied and the voltage level thereof is stabilized or a predetermined period of time passes after memory power supply voltage VDDH is applied, memory power on detection signal /PORH attains the H level and the boosting operation of VPP generation circuit 45 for VDDL is stopped. On the other hand, while memory power on detection signal /PORH is at the L level, VDDH precharge circuit 41 performs a precharge operation. During this period, the logic power on detection signal /PORL already rises to the H level and the precharge operation of VDDH precharge circuit 40 is stopped. If VPP generation circuit 32 for VDDH performs a boosting operation in accordance wit memory power supply voltage VDDH that is in a transient state, VDDH precharge circuit 41 precharges the high voltage output node 37 to the memory power supply voltage VDDH level until memory power supply voltage VDDH is stabilized and an effective boosting operation is started by the VPP generation circuit 32. The high voltage output node 37 is precharged to the memory power supply voltage VDDH level until VPP generation circuit 32 for VDDH performs an effective boosting operation, thereby preventing the voltage of high voltage output node 37 from becoming unstable.

Accordingly, if the high voltage output node 37 is precharged to a voltage level equal to or lower than the memory power supply voltage VDDH level by the boosting operation of VPP generation circuit 45 for VDDL upon application of memory power supply voltage VDDH, VDDH precharge circuit 41 reliably precharges the high voltage output node 37 to the memory power supply voltage VDDH level.

Furthermore, even if the voltage level of high voltage output node 37 becomes higher than the memory power supply voltage VDDH level by the boosting operation of VPP generation circuit 45 for VDDL, MOS transistor (40c) at the output stage as shown in FIG. 27 can be reliably kept nonconductive with the gate voltage of the MOS transistor (40c) at the output stage set at the voltage level of (VDDH+Vth), as in the case of the construction shown in FIG. 30, to prevent an adverse effect of the higher precharged voltage at the high voltage output node on the boosting operation of VPP generation circuit 45 for VDDL. In this case, the MOS transistor (40c) at the output stage of VDDH precharge circuit 41 does not perform a precharge operation.

On the other hand, if memory power supply voltage VDDH is applied first, VDDH precharge circuit 41 performs a precharge operation in the transient period of memory power supply voltage VDDH to precharge the high voltage output node 37 to the memory power supply voltage VDDH level. If memory power supply voltage VDDH is stabilized and VPP generation circuit 32 for VDDH performs a stable boosting operation and generates boosted voltage VPP, then memory power on detection signal /PORH attains the H level and the precharge operation of VDDH precharge circuit 41 is stopped.

Then, if logic power supply voltage VDDL is applied, VDDL precharge circuit 40 is activated while logic power on detection signal /PORL is at the L level and VDDL precharge circuit 40 is allowed to perform a precharge operation. However, the voltage level of high voltage output node 37 is boosted by VPP generation circuit 32 for VDDH in accordance with memory power supply voltage VDDH applied before application of logic power supply voltage VDDL, VDDL precharge circuit 40 is prohibited from performing a precharge operation and the precharge operation of VDDL precharge circuit 40 does not influence boosted voltage VPP from high voltage output node 37.

If logic power on detection signal /PORL becomes the H level, VDDL precharge circuit 40 is set in a disabled state and the charge pump in circuit 40 is inactivated, thereby reliably holding the MOS transistor at the output stage of circuit 40 in the off state.

As stated so far, according to the fifteenth embodiment of the present invention, the high voltage output node is adapted to be perchaged to a predetermined voltage level in accordance with the power on detection signal while a boosting operation is being performed in accordance with the unstable power supply voltage. It is, therefore, possible to prevent the high voltage output node from entering a floating state or into an unstable voltage state, to reliably holding the parasitic bipolar transistor non-conductive to suppress a latch-up phenomenon.

Moreover, the circuit generating a boosted voltage using the logic power supply voltage is adapted to be operable only when the memory power on detection signal is at the L level, thereby making it possible to reduce current consumption.

[Sixteenth Embodiment]

Figure 32:
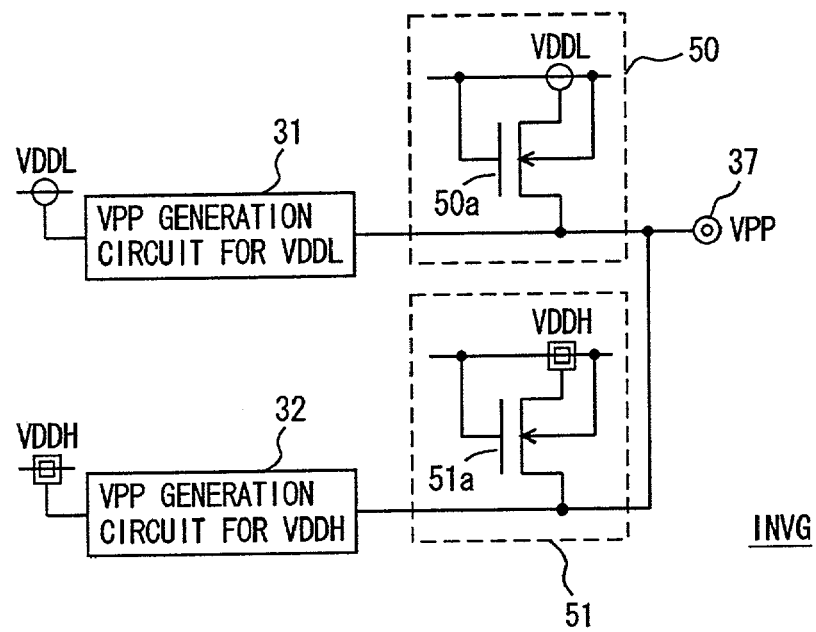
FIG. 32 is a schematic diagram showing the construction of a boosted voltage generation circuit in a sixteenth embodiment according to the present invention.

FIG. 32 is a schematic diagram showing the construction of a boosted voltage generation circuit in the sixteenth embodiment according to the present invention. The construction of the boosted voltage generation circuit shown in FIG. 32 differs from that of the boosted voltage generation circuit show in FIG. 20 in the following point. In FIG. 32, precharge circuits 50 and 51 are provided to high voltage output node 37. Precharge circuit 50 includes an N channel MOS transistor 50a having a gate, a drain and a back gate connected together to the logic power source node and having a source connected to high voltage output node 37. Precharge circuit 51 includes an N channel MOS transistor 51a having a gate, a drain and a back gate connected together to the memory power source node and having a source connected to high voltage output node 37.

MOS transistors 50a and 51a are each diode-connected and operate in a diode mode. When logic power supply voltage VDDL is applied, precharge circuit 50 sets the lower limit voltage level of high voltage output node 37 at a voltage level of (VDDL−Vthn). When memory power supply voltage VDDH is applied, precharge circuit 51 sets the lower limit voltage level of high voltage output node 37 at a voltage level of (VDDH−Vthn). Here, Vthn indicates the threshold voltage of each of MOS transistors 50a and 51a.

If boosted voltage VPP of high voltage output node 37 becomes equal to or higher than voltage (VDDL−Vthn) through the boosting operation, MOS transistor 50a is rendered non-conductive. If boosted voltage VPP of high voltage output node 37 becomes equal to or higher than voltage (VDDH−Vthn), MOS transistor 51a is rendered non-conductive. Therefore, if the boosting operation of the corresponding VPP generation circuit is insufficient in accordance with the power supply voltage applied first, each of precharge circuits 50 and 51 precharges the high voltage output node to a voltage level according to the corresponding power supply voltage. When the boosting operation is stabilized and the voltage level of boosted voltage VPP becomes a voltage level according to the corresponding power supply voltage, each of precharge circuits 50 and 51 enters a nonconductive state and exerts no adverse effect on the boosting operation of the VPP generation circuit.

If the high voltage output node 37 is precharged to the level of the power supply voltage first applied at the start of the boosting operation, it is possible to assist in the boosting operation for boosting the voltage of high voltage output node 37, and boosted voltage VPP can be driven to a predetermined voltage level at high speed. In addition, by setting the lower limit value of the voltage level of high voltage output node 37 at a voltage level according to the power supply voltage applied first, it is possible to prevent the base to emitter region of parasitic bipolar transistor Q1 from being forwardly biased.

Moreover, by utilizing an N channel MOS transistor as a lower limit voltage clamping element, it is possible to connect the back gate (substrate region) of the clamping MOS transistor to the corresponding power source node. Thus, it is not required to apply a boosted voltage to the back gate of the clamping MOS transistor, to prevent the back gate of the lower limit voltage clamping transistor from entering a floating state when a power supply voltage is applied, and to reliably clamp the voltage level of the high voltage output node to a predetermined voltage level.

In addition, by connecting the back gate of the clamping MOS transistor to the corresponding power source node, it is possible to set a clamped voltage level based on the diffusion potential of the PN junction of the clamping MOS transistor, to make the clamped voltage level higher than that in the construction using the threshold voltage of the clamping MOS transistor and to reliably prevent the base to emitter region of the parasitic bipolar transistor from being forwardly biased.

In FIG. 32, N channel MOS transistors 50a and 51a are used for precharge circuits 50 and 51, respectively. Alternatively, diode-connected P channel MOS transistors may be used for precharge circuits 50 and 51, respectively. If such diode-connected P channel MOS transistors are used for precharge circuits 50 and 51, respectively, the high voltage output node 37 is precharged (clamped) to the voltage level of voltage (VDDL–Vthp) or voltage (VDDH–Vthp).

In the construction of the boosted voltage generation circuit shown in FIG. 32, it is possible to precharge the high voltage output node 37 to a voltage level according to the power supply voltage applied first irrespectively of the power up sequence of the power supply voltages, to reliably suppress a latch-up phenomenon. In addition, since each precharge circuit is constituted of one MOS transistor, it is possible to reduce a circuit layout area.

[Seventeenth Embodiment]

Figure 33:
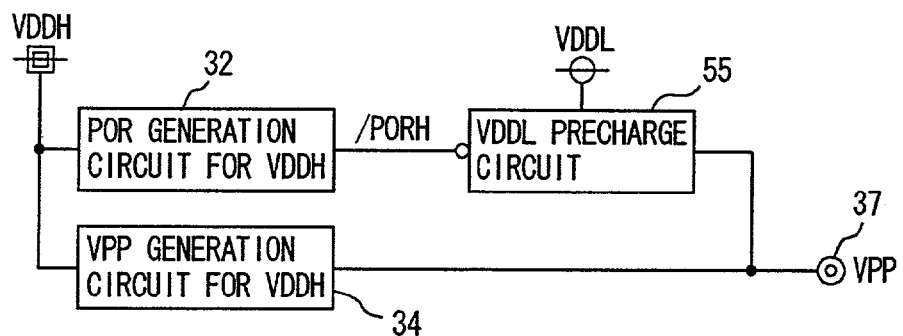
FIG. 33 is a schematic diagram showing the construction of a boosted voltage generation circuit in a seventeenth embodiment according to the present invention.

FIG. 33 is a schematic diagram showing the construction of a boosted voltage generation circuit in the seventeenth embodiment according to the present invention. In the boosted voltage generation circuit shown in FIG. 33, charges are supplied to high voltage output node 37 from VPP generation circuit 34 for VDDH for generating boosted voltage VPP onto the high voltage output node 37. No VPP generation circuit for VDDL receiving logic power supply voltage VDDL is provided in the boosted voltage generation circuit shown in FIG. 33.

This boosted voltage generation circuit further includes a VDDL precharge circuit 55 for precharging the high voltage output node 37 to the logic power supply voltage VDDL level when memory power on detection signal /PORH from VPP generation circuit 32 for VDDH is at the L level. The construction of VDDL precharge circuit 55 is the same as that of the precharge circuit shown in FIG. 27.

In the boosted voltage generation circuit shown in FIG. 33, if logic power supply voltage VDDL is applied before application of memory power supply voltage VDDH, VDDL precharge circuit 55 precharges the high voltage output node 37 to the logic power supply voltage VDDL level since memory power on detection signal /PORH is at the L level. When memory power supply voltage VDDH is applied next, VPP generation circuit 34 for VDDH operates in accordance with memory power supply voltage VDDH. When memory power supply voltage VDDH is stabilized, memory power on detection signal /PORH attains the H level and VDDL precharge circuit 55 completes the precharging operation.

After memory power supply voltage VDDH is applied, the voltage level of high voltage output node 37 is ensured in accordance with logic power supply voltage VDDL applied first until the boosting operation is effectively performed in accordance with memory power supply voltage VDDH. As a result, even if logic power supply voltage VDDL is applied first, it is possible to prevent the voltage level of high voltage output node 37 from becoming unstable or decreasing to a predetermined voltage level or lower, to prevent the region between base and emitter of parasitic bipolar transistor Q1 from being forwardly biased.

If VPP generation circuit 34 for VDDH performs a boosting operation in accordance with memory power supply voltage VDDH, the oscillation signal of an oscillation circuit included in VPP generation circuit 34 for VDDH does not change between predetermined voltage levels and in a transient state, and therefore, the operation of VPP generation circuit 34 for VDDH is unstable. In this unstable period, VDDL precharge circuit 55 precharges the high voltage output node 37 to the logic power supply voltage VDDL level. Thus, even if logic power supply voltage is applied first, the high voltage output node 37 is precharge to the logic power supply voltage VDDL level in the transient period. It is, therefore, possible to reliably prevent the base to emitter region of the parasitic bipolar transistor, shown in FIG. 40, from being forwardly biased and therefore to reliably suppress a latch-up phenomenon.

When memory power on detection signal /PORH attains the H level, VPP generation circuit 34 for VDDH performs a boosting operation using stabilized memory power source VDDH. As a result, the voltage level of boosted voltage VPP on high voltage output node 37 further rises from the precharged voltage level.

If memory power supply voltage VDDH is applied first, VPP generation circuit 34 for VDDH operates and supplies charges to high voltage output node 37. When the voltage level of memory power supply voltage VDDH becomes equal to or higher than a predetermined voltage level, VPP generation circuit 34 for VDDH starts a boosting operation. When memory power supply voltage VDDH is stabilized and VPP generation circuit 34 for VDDH stably performs the boosted operation, memory power on detection signal /PORH is at the H level. Accordingly, even if logic power supply voltage VDDL is applied thereafter, VDDL precharge circuit 55 is prohibited from performing a precharge operation and VPP generation circuit 34 for VDDH drives the high voltage output node 37 to a predetermined voltage level. In this case as well, if memory power supply voltage VDDH is applied first, logic power supply voltage VDDL is at the ground voltage level to prevent the base to emitter region of parasitic bipolar transistor Q1 from being forwardly biased.

In the construction shown in FIG. 33, boosted voltage VPP is generated simply using memory power supply voltage VDDH and the circuit generating boosted voltage VPP using logic power supply voltage VDDL is not employed.

Thus, the number of circuits for performing boosting operations is decreased, a circuit layout area is reduced and current consumption is reduced.

[Eighteenth Embodiment]

Figure 34:
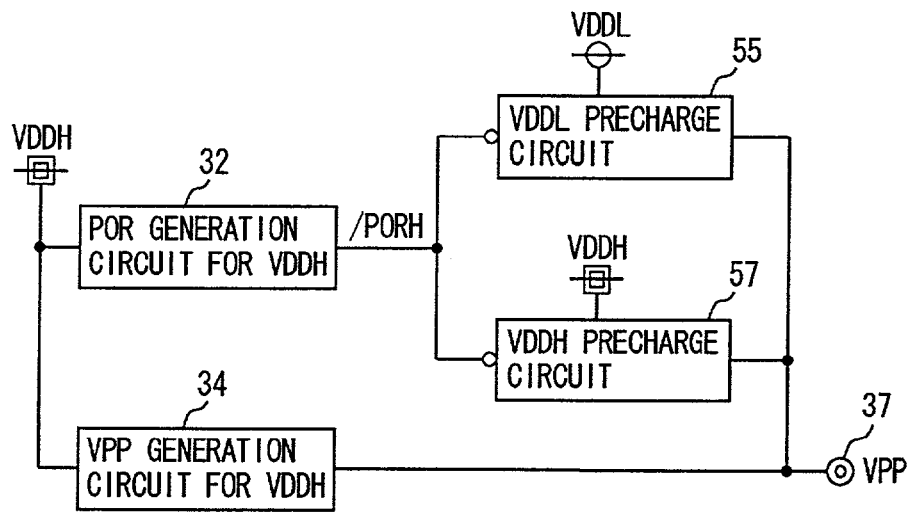
FIG. 34 is a schematic diagram showing the construction of a boosted voltage generation circuit in an eighteenth embodiment according to the present invention.

FIG. 34 is a schematic diagram showing the construction of a boosted voltage generation circuit in the eighteenth embodiment according to the present invention. The construction of the boosted voltage generation circuit shown in FIG. 34 differs from that of the boosted voltage generation circuit shown in FIG. 33 in the following point. In FIG. 34, the boosted voltage generation circuit further includes a VDDH precharge circuit 57 provided in parallel to VDDL precharge circuit 55 and precharging the high voltage output node 37 to the memory power supply voltage VDDH level when memory power on detection signal /PORH is at the L level. The remaining construction of the boosted voltage generation circuit shown in FIG. 34 is the same as that of the boosted voltage generation circuit shown in FIG. 33. Therefore, corresponding components are denoted by the same reference numerals as those in FIG. 33 and detailed description will not be given thereto.

In the boosted voltage generation circuit shown in FIG. 34, if memory power supply voltage VDDH is applied first, VDDH precharge circuit 57 precharges the high voltage output node 37 to the memory power supply voltage VDDH level while memory power on detection signal /PORH is at the L level. Accordingly, while memory power supply voltage VDDH is applied and VPP generation circuit 34 for VDDH operates in a transient state and the output voltage thereof is unstable, precharge circuit 57 for VDDH precharges the high voltage output node 37 to memory power supply voltage VDDH level and ensures the precharged voltage level. Thus, it is possible to stabilize the voltage level of high voltage output node 37, to prevent the turn on of parasitic bipolar transistor Q1 by noise or the like in the transient period immediately after the power up.

On the other hand, if logic power supply voltage VDDL is applied first, VDDL precharge circuit 55 precharges the high voltage output node 37 to the logic power supply voltage VDDL level. VDDL precharge circuit 55 is allowed to perform the precharge operation until memory power supply voltage VDDH is applied and VPP generation circuit 34 for VDDH effectively starts a boosting operation. Since memory power on detection signal /PORH is at the L level, VDDH precharge circuit 57 also performs a precharge operation. In this period, therefore, the high voltage output node 37 is precharged according to two precharge circuits 55 and 57.

Precharge circuits 55 and 57 each have the same construction as that of the precharge circuit shown in FIG. 27. If the gate voltage of the transistor (40c) in the output stage of VDDL precharge circuit 55 is at a voltage level of about (VDDL+Vth), even when the voltage level of memory power supply voltage VDDH rises and the output voltage level of VDDH precharge circuit 57 becomes higher than that of VDDL precharge circuit 55, the precharging MOS transistor is reliably kept non-conductive and it is possible to prevent a current flowing from the memory power source node to the logic power source node.

When memory power on detection signal /PORH attains the H level and VPP generation circuit 34 for VDDH starts a boosting operation in accordance with stable memory power supply voltage VDDH, the high voltage output node 37 is driven to a predetermined voltage level by VPP generation circuit 34 for VDDH.

Accordingly, if the boosted voltage generation circuit shown in FIG. 34 is used, it is possible to precharge the high voltage output node 37 to the logic power supply voltage level or the memory power supply voltage level until the voltage of high voltage output node 37 is stably driven. It is, therefore, possible to prevent the base to emitter region of parasitic bipolar transistor Q1 from being forwardly biased irrespectively of the power supply voltage application sequence, to suppress a latch-up phenomenon. In addition, since only one VPP generation circuit is used, current consumption can be reduced.

[Nineteenth Embodiment]

Figure 35:
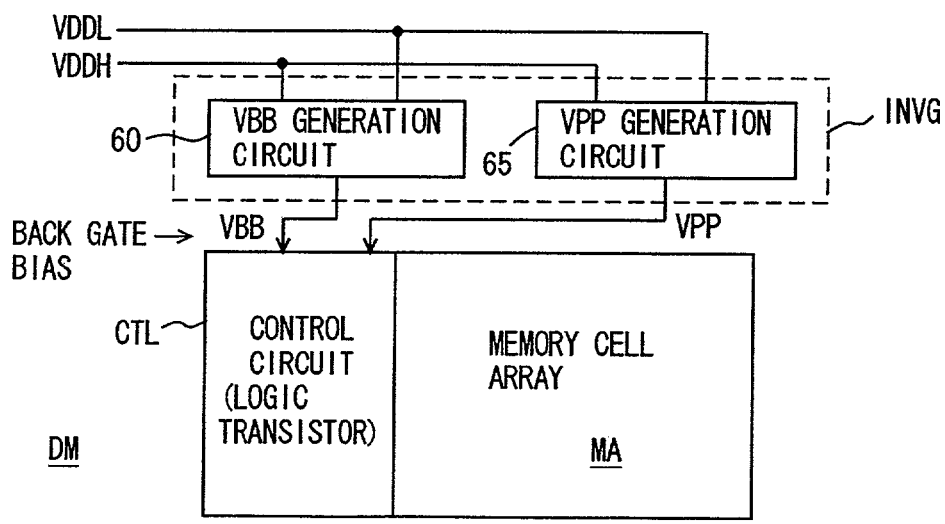
FIG. 35 is a schematic diagram showing the construction of a boosted voltage generation circuit in a nineteenth embodiment according to the present invention.

FIG. 35 is a schematic diagram showing the construction of a main portion of a DRAM macro in the nineteenth embodiment according to the present invention. In FIG. 35, internal voltage generation circuit INVG includes a VBB generation circuit 60 for generating negative voltage (substrate bias voltage) VBB in accordance with logic power supply voltage VDDL and memory power supply voltage VDDH, and a VPP generation circuit 65 for generating boosted voltage VPP in accordance with logic power supply voltage VDDL and memory power supply voltage VDDH. Negative voltage VBB from VBB generation circuit 60 and boosted voltage VPP from VPP generation circuit 65 are applied to the substrate regions of a logic transistor included in control circuit CTL as a well bias (back gate bias).

Negative voltage VBB from VBB generation circuit 60 may be, or may not be the same in voltage level as the substrate bias voltage applied to the substrate region of memory cell array MA. Also, boosted voltage VPP generated by VPP generation circuit 65 may be, or may not be the same in voltage level as a high voltage for driving word lines applied to a not shown row decoder.

Control circuit CTL employs, as a component a logic transistor manufactured through the same manufacturing steps as those of a logic which is not shown. This logic transistor is, therefore, a low-Vth transistor having a small absolute value of the threshold voltage thereof.

Each of VBB generation circuit 60 and VPP generation circuit 65 has the circuit construction described in the previous first to eighteenth embodiment and has a mechanism for suppressing a latch-up phenomenon when power is up. Thus, bias voltages VBB and VPP are stably generated and applied to the back gates of the logic transistors in control circuit CTL. Consequently, the logic transistors in control circuit CTL are stably operated without causing a latch-up phenomenon, and the standby current can be reduced through the adjustment of the threshold voltage of these low-Vth transistors. Thus, a stably operating DRAM macro with low consumption current can be implemented with low manufacturing cost.

In the above description, an embedded DRAM merged with a logic is shown by way of example.; The present invention is applicable to any semiconductor device formed through CMOS process and using a plurality of power sources.

As stated so far, according to the present invention, a semiconductor device operating with multiple power sources is constituted to prevent the internal voltage output node from entering a floating state or an unstable state when a power is up. Thus, it becomes possible to prevent the turning on of parasitic bipolar transistor when the power is up to reliably suppress a latch-up phenomenon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

first internal voltage generation circuitry for generating a voltage internal with respect to said semiconductor device in accordance with a first power supply voltage external with respect to said semiconductor device, second internal voltage generation circuitry for generating said internal voltage in accordance with a second power supply voltage external with respect to said semiconductor device, said first and second power supply voltages being supplied to said semiconductor device independently and individually upon operation of said semiconductor device, through different paths, and said internal voltage being different in a voltage level from said first and second power supply voltages, a power on detection circuit for detecting power on of said first power supply voltage, and generating a power on detection signal in accordance with a detection result; and a voltage holding circuit receiving said second power supply voltage as one operating power supply voltage, for setting said internal voltage at a level of said second power supply voltage in response to the power on detection signal from said power on detection circuit.

2. The semiconductor device according to claim 1, wherein when said power on detection signal is activated, said second internal voltage generation circuitry is allowed to perform an operation for generating said internal voltage.

3. A semiconductor device comprising:

first internal voltage generation circuitry for generating a voltage internal with respect to said semiconductor device in accordance with a first power supply voltage external with respect to said semiconductor device, second internal voltage generation circuitry for generating said internal voltage in accordance with a second power supply voltage external with respect to said semiconductor device, said first and second power supply voltages being supplied to said semiconductor device independently and individually upon operation of said semiconductor device, through different paths, and said internal voltage being different in a voltage level from said first and second power supply voltages, a first power on detection circuit for detecting power on of said first power supply voltage, and generating a first power on detection signal in accordance with a detection result;

a second power on detection circuit for detecting power on of said second power supply voltage, and generating a second power on detection signal in accordance with a detection result;

a first voltage setting circuit receiving said first power supply voltage as an operating power supply voltage, for setting said internal voltage at a level of said first power supply voltage in response to the second power on detection signal from said second power on detection circuit; and a second voltage setting circuit receiving said second power supply voltage as an operating power supply voltage, for setting said internal voltage at a level of said second power supply voltage in response to the second power on detection signal from said second power on detection circuit.

4. The semiconductor device according to claim 3, wherein when said first power on detection signal is activated, said second internal voltage generation circuit is allowed to perform an operation for generating said internal voltage.

5. A semiconductor device comprising:

first internal voltage generation circuitry for generating a voltage internal with respect to said semiconductor device in accordance with a first power supply voltage external with respect to said semiconductor device, second internal voltage generation circuitry for generating said internal voltage in accordance with a second power supply voltage external with respect to said semiconductor device, said first and second power supply voltages being supplied to said semiconductor device independently and individually upon operation of said semiconductor device, through different paths, and said internal voltage being different in a voltage level from said first and second power supply voltages, a first voltage setting circuit for setting said internal voltage at a voltage level corresponding to a level of said first power supply voltage in response to power on of said first power supply voltage; and a second voltage setting circuit for setting said internal voltage at a voltage level corresponding to a level of said second power supply voltage in response to power on of said second power supply voltage.

* * * * *